(12) United States Patent
Kuwabara et al.

(10) Patent No.: US 12,701,658 B2
(45) Date of Patent: Aug. 4, 2026

(54) WIRING SUBSTRATE

(71) Applicant: IBIDEN CO., LTD., Ogaki (JP)

(72) Inventors: Masashi Kuwabara, Ibi-gun (JP);
Susumu Kagohashi, Ogaki (JP)

(73) Assignee: IBIDEN CO., LTD., Ogaki (JP)

( * ) Notice: Subject to any disclaimer, the term of this
patent is extended or adjusted under 35
U.S.C. 154(b) by 311 days.

(21) Appl. No.: 18/623,091

(22) Filed: Apr. 1, 2024

(65) Prior Publication Data

US 2024/0341034 A1     Oct. 10, 2024

(30) Foreign Application Priority Data

Apr. 4, 2023     (JP) .................................. 2023-060631

(51) Int. Cl.
*H05K 1/11* (2006.01)
*H05K 1/02* (2006.01)
(Continued)

(52) U.S. Cl.
CPC ........... *H05K 1/116* (2013.01); *H05K 1/0242*
(2013.01); *H05K 1/09* (2013.01); *H05K 3/002*
(2013.01);
(Continued)

(58) Field of Classification Search
CPC ........ H05K 1/116; H05K 1/0242; H05K 1/09;
H05K 3/002; H05K 3/005; H05K 3/0041;
H05K 3/108; H05K 3/423; H05K 1/0306;
H05K 1/0373; H05K 2201/0209; H05K
2201/0338; H05K 2201/096; H05K
2203/0723; H05K 1/11; H05K 1/02;
H05K 1/03; H05K 3/00; H05K 3/10;
H05K 3/42; H05K 3/46
(Continued)

(56) References Cited

U.S. PATENT DOCUMENTS

| | | | | |
|---|---|---|---|---|
| 7,119,439 B2 * | 10/2006 | Watanabe | ........... | H10W 20/033 |
| | | | | 257/758 |
| 8,436,252 B2 * | 5/2013 | Kawano | ................. | H05K 3/421 |
| | | | | 174/250 |
| 8,563,873 B2 * | 10/2013 | Niki | ....................... | H05K 3/422 |
| | | | | 174/266 |
| 10,219,374 B2 * | 2/2019 | Ishihara | ................. | H05K 1/112 |
| 10,827,622 B2 * | 11/2020 | Nakamura | ............. | H05K 3/007 |

(Continued)

FOREIGN PATENT DOCUMENTS

JP         2015-133473 A       7/2015

*Primary Examiner* — Angel R Estrada

(74) *Attorney, Agent, or Firm* — Finnegan, Henderson,
Farabow, Garrett & Dunner, LLP

(57)     ABSTRACT

A wiring substrate includes a core substrate having a
through-hole conductor, a resin insulating layer formed on
the core substrate, a conductor layer formed on the insulat-
ing layer and including a seed layer and an electrolytic
plating layer, and a via conductor formed in the insulating
layer. The via conductor electrically connects the through-
hole conductor and conductor layer. The via conductor
includes the seed layer and electrolytic plating layer extend-
ing from the conductor layer. The core substrate includes a
glass substrate and has a through hole penetrating through
the glass substrate. The through-hole conductor is formed in
the through hole. The seed layer is covering inner wall
surface of the insulating layer in opening in which the via
conductor is formed. The seed layer has a first portion and
a second portion electrically connected to the first portion.
That part of the first portion is formed on the second portion.

20 Claims, 11 Drawing Sheets

(51) Int. Cl.

| | |
|---|---|
| *H05K 1/09* | (2006.01) |
| *H05K 3/00* | (2006.01) |
| *H05K 3/10* | (2006.01) |
| *H05K 3/42* | (2006.01) |
| H05K 1/03 | (2006.01) |

(52) U.S. Cl.
CPC ......... *H05K 3/0035* (2013.01); *H05K 3/0041* (2013.01); *H05K 3/108* (2013.01); *H05K 3/423* (2013.01); *H05K 1/0306* (2013.01); *H05K 1/0373* (2013.01); *H05K 2201/0209* (2013.01); *H05K 2201/0338* (2013.01); *H05K 2201/096* (2013.01); *H05K 2203/0723* (2013.01)

(58) Field of Classification Search
USPC ............... 174/257, 258, 260, 261, 256, 266; 257/211, 499, 688, 758, 678; 361/760, 361/761, 762, 790, 795
See application file for complete search history.

(56) References Cited

U.S. PATENT DOCUMENTS

| | | | | |
|---|---|---|---|---|
| 11,627,659 | B2 * | 4/2023 | Park | H05K 1/0298 |
| | | | | 361/760 |
| 12,477,663 | B2 * | 11/2025 | Kagohashi | H05K 3/4688 |
| 12,538,435 | B2 * | 1/2026 | Kagohashi | H05K 3/42 |
| 12,543,273 | B2 * | 2/2026 | Sakai | H05K 1/0373 |
| 12,568,578 | B2 * | 3/2026 | Sakai | H05K 1/112 |
| 2022/0071016 | A1 | 3/2022 | Hwang et al. | |

* cited by examiner

BED-C  6.00kV  WD 4.0mm  ⬛x20.0k  Std.P.C.75.0  STD ▬▬ 0.5µm  Aoyanagi Lab.
FOV:6.40x4.80µm  HV  07/10/2021

WIRING SUBSTRATE

CROSS-REFERENCE TO RELATED APPLICATIONS

The present application is based upon and claims the benefit of priority to Japanese Patent Application No. 2023-060631, filed Apr. 4, 2023, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2015-133473 describes a multilayer substrate having a core formed of a glass material. The entire contents of this publication are incorporated herein by reference.

SUMMARY OF THE INVENTION

According to one aspect of the present invention, a wiring substrate includes a core substrate having a through-hole conductor, a resin insulating layer formed on the core substrate, a conductor layer formed on the resin insulating layer and including a seed layer and an electrolytic plating layer formed on the seed layer, and a via conductor formed in the resin insulating layer such that the via conductor electrically connects the through-hole conductor and the conductor layer and that the via conductor includes the seed layer and electrolytic plating layer extending from the conductor layer. The core substrate includes a glass substrate and has a through hole penetrating through the glass substrate such that the through-hole conductor is formed in the through hole, and the via conductor is formed such that the seed layer is covering an inner wall surface of the resin insulating layer in an opening in which the via conductor is formed, that the seed layer has a first portion and a second portion electrically connected to the first portion and that a part of the first portion is formed on the second portion.

According to another aspect of the present invention, a method for manufacturing a wiring substrate includes forming a core substrate having a through-hole conductor, forming a resin insulating layer on the core substrate, forming a conductor layer on the resin insulating layer such that the conductor layer includes a seed layer and an electrolytic plating layer formed on the seed layer, and forming a via conductor in the resin insulating layer such that the via conductor electrically connects the through-hole conductor and the conductor layer and that the via conductor includes the seed layer and electrolytic plating layer extending from the conductor layer. The forming the core substrate includes forming a through hole penetrating through a glass substrate and forming the through-hole conductor in the through hole, and the forming the via conductor includes forming the seed layer in an opening formed in the resin insulating layer such that the seed layer covers an inner wall surface of the resin insulating layer in the opening, that the seed layer has a first portion and a second portion electrically connected to the first portion and that a part of the first portion is formed on the second portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
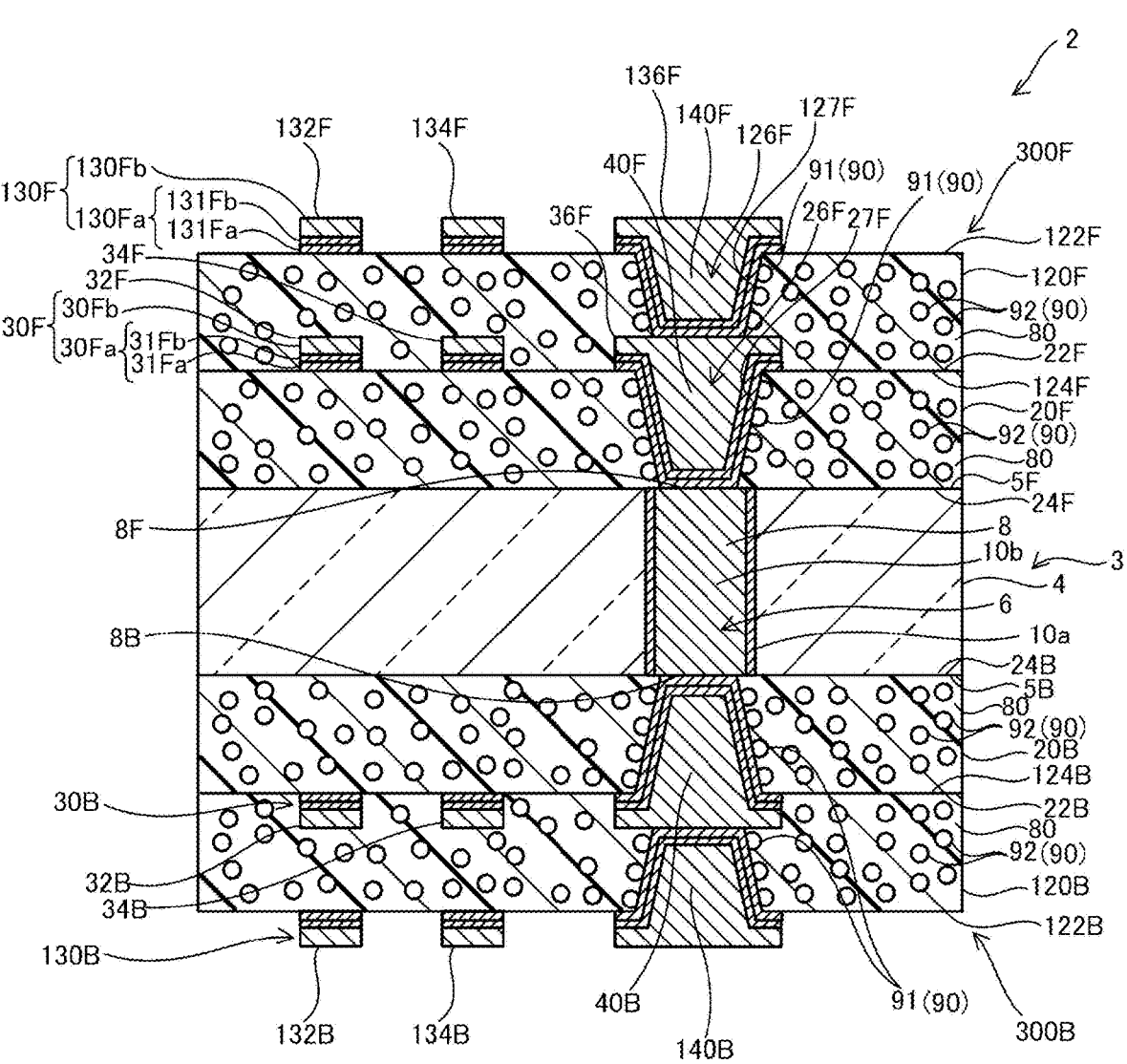
FIG. 1 is a cross-sectional view schematically illustrating a wiring substrate according to an embodiment of the present invention.

Embodiments will now be described with reference to the accompanying drawings, wherein like reference numerals designate corresponding or identical elements throughout the various drawings.

Embodiment

Figure 2A:
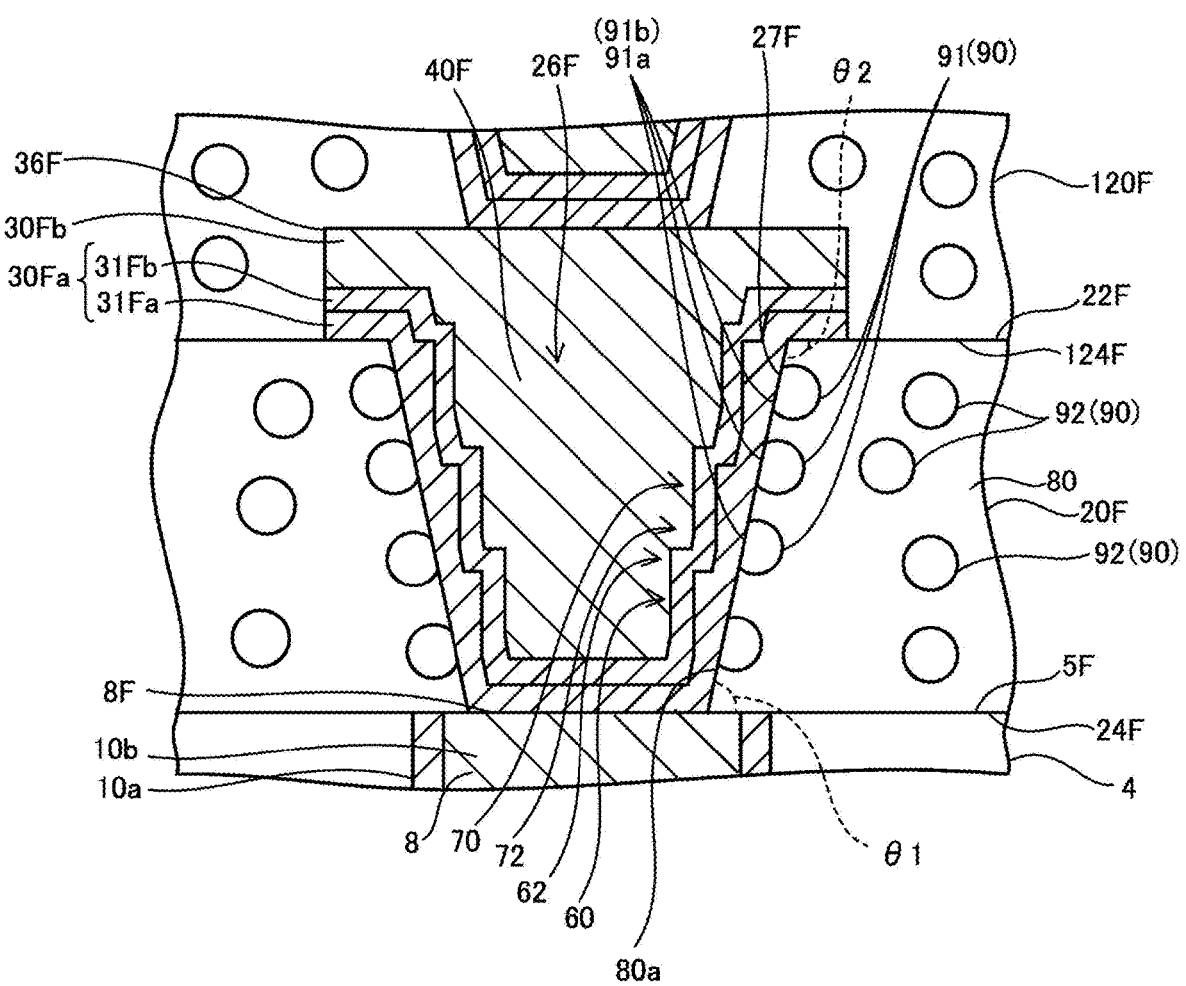
FIG. 2A is an enlarged cross-sectional view schematically illustrating a part of a wiring substrate according to an embodiment of the present invention.

FIG. 1 is a cross-sectional view illustrating a wiring substrate 2 of an embodiment. FIG. 2A is an enlarged cross-sectional view illustrating a part of the wiring substrate 2 of the embodiment. As illustrated in FIG. 1, the wiring substrate 2 includes a core substrate 3, a front side build-up layer (300F), and a back side build-up layer (300B).

The core substrate 3 includes a substrate 4, through holes 6, and through-hole conductors 8. The substrate 4 has a front surface (5F) and a back surface (5B) on the opposite side with respect to the front surface (5F). The substrate 4 is formed of glass. The through holes 6 penetrate the substrate 4. The through holes 6 each have a substantially cylindrical shape. The through holes 6 each have a substantially constant diameter. It is also possible that the through holes 6 each have a substantially truncated cone shape. It is also possible that the through holes 6 each have a shape obtained by connecting two substantially conical shapes. The two cones are a front surface side cone and a back surface side cone. A bottom surface of the front surface side cone is positioned on the front surface (5F), and a bottom surface of the back surface side cone is positioned on the back surface (5B). In this case, a side surface of each of the through holes 6 is formed of a surface tapering from the front surface (5F) toward the back surface (5B) and a surface tapering from the back surface (5B) toward the front surface (5F).

The through-hole conductors 8 are respectively formed in the through holes 6. The through-hole conductors 8 are mainly formed of copper. The through-hole conductors 8 include a seed layer (10a) formed on inner wall surfaces of the through holes 6 and an electrolytic plating layer (10b) formed on the seed layer (10a). The electrolytic plating layer (10b) fills the through holes 6. The seed layer (10a) is formed by electroless plating. The through-hole conductors 8 each have an upper end (8F) and a lower end (8B). A surface of the upper end (8F) and the front surface (5F) form substantially the same flat surface. A surface of the lower end (8B) and the back surface (5B) form substantially the same flat surface. The upper end (8F) is exposed from the front surface (5F). The lower end (8B) is exposed from the back surface (5B).

The front side build-up layer (300F) is formed on the front surface (5F) of the substrate 4. The front side build-up layer (300F) includes front side resin insulating layers, front side conductor layers, and front side via conductors that penetrate the front side resin insulating layers. The front side conductor layers and the front side via conductors are electrically connected to the through-hole conductors 8. The front side resin insulating layers and the front side conductor layers are alternately laminated. The front side resin insulating layers in FIG. 1 are a first resin insulating layer (20F) and a second resin insulating layer (120F). The front side conductor layers are a first conductor layer (30F) and a second conductor layer (130F). The front side via conductors are first via conductors (40F) and second via conductors (140F).

The first resin insulating layer (20F) has a first surface (22F) and a second surface (24F) on the opposite side with respect to the first surface (22F). The first resin insulating layer (20F) is formed on the front surface (5F) of the substrate 4 with the second surface (24F) facing the front surface (5F). In the example of FIG. 1, the second surface (24F) is in contact with the front surface (5F). The second surface (24F) is in contact with a part of the upper end (8F). No conductor circuit exists between the front surface (5F) and the second surface (24F). No conductor circuit is formed on the front surface (5F). The first resin insulating layer (20F) has first openings (26F) that respectively reach the upper ends (8F) of the through-hole conductors 8. The first openings (26F) each have an opening (top opening) on the first surface (22F) and an opening (bottom opening) on the second surface (24F). The top opening and the bottom opening each have a substantially circular shape. The bottom opening can expose the upper end (8F) and the front surface (5F) at the same time. In this case, the front surface (5F) around the upper end (8F) is exposed. It is also possible that the bottom opening exposes a part of the upper end (8F) and the front surface (5F) around the part (first example). It is also possible that the bottom opening exposes the entire upper end (8F) and the front surface (5F) around the upper end (8F) (second example). As illustrated in FIG. 1, the bottom opening can expose only the upper end (8F) (third example). Two examples among the first example, the second example and the third example may be mixed. All of the first example, the second example and the third example may be mixed. It is preferable that the first example and the third example are mixed. In this case, the upper ends (8F) of some of the through-hole conductors 8 are exposed by the openings of the first example, and the upper ends (8F) of the remaining through-hole conductors are exposed by the openings of the third example. The first resin insulating layer (20F) is formed of a resin 80 and a large number of inorganic particles 90 dispersed in the resin 80. The resin 80 is an epoxy resin. Examples of the resin include a thermosetting resin and a photocurable resin. The inorganic particles 90 are glass particles. It is also possible that the inorganic particles 90 are alumina particles. A content of the inorganic particles 90 in the first resin insulating layer (20F) is 75 wt % or more.

As illustrated in FIGS. 1 and 2A, the inorganic particles 90 include first inorganic particles 91 forming an inner wall surface (27F) of each of the first openings (26F) and second inorganic particles 92 embedded in the resin 80. The second inorganic particles 92 each have a spherical shape. The first inorganic particles 91 each have a shape obtained by cutting a sphere along a flat surface. The first inorganic particles 91 each have a shape obtained by cutting a second inorganic particle 92 along a flat surface. The first inorganic particles 91 and the second inorganic particles 92 are different in shape.

The first surface (22F) of the first resin insulating layer (20F) is formed only of the resin 80. No inorganic particles 90 (second inorganic particles 92) are exposed from the first surface (22F). The first surface (22F) does not include surfaces of the second inorganic particles 92. No unevenness is formed on the first surface (22F) of the first resin insulating layer (20F). The first surface (22F) is not roughened. The first surface (22F) is formed smooth.

Figures 3, 4A:
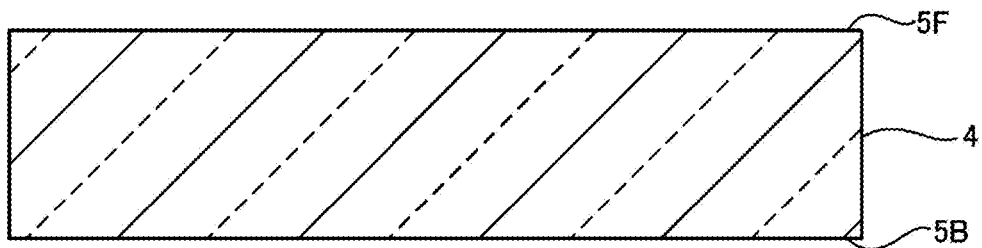
FIG. 3 is a cross-sectional photograph schematically showing a part of a wiring substrate according to an embodiment of the present invention.
FIG. 4A is a cross-sectional view schematically illustrating a method for manufacturing a wiring substrate according to an embodiment of the present invention.

FIG. 3 is a cross-sectional photograph showing an example of the inner wall surface (27F) of the each of the first openings (26F). As shown in FIGS. 2A and 3, the inner wall surface (27F) of each of the first openings (26F) is formed of the resin 80 and the first inorganic particles 91. The first inorganic particles 91 each have a flat part (91a). The flat parts (91a) form the inner wall surface (27F). The inner wall surface (27F) is formed of the resin 80 and the flat parts (91a). The flat parts (91a) and a surface of the resin 80 that forms the inner wall surface (27F) form substantially a common surface. No unevenness is formed on the resin 80 that forms the inner wall surface (27F). The surface of the resin 80 that forms the inner wall surface (27F) is smooth. No unevenness is formed on exposed surfaces (91b) of the flat parts (91a) (surfaces that form the inner wall surface (27F)). The exposed surfaces (91b) of the flat parts (91a) are smooth. The inner wall surface (27F) is formed smooth. The inner wall surface (27F) has an arithmetic mean roughness (Ra) of 1.0 μm or less. As shown in FIG. 3, steps 28 are formed at boundary parts between the surface (80a) of the resin 80 and the flat parts (91a) of the first inorganic particles 91. Sizes of the steps 28 are preferably 3.0 μm or less, more preferably 1.5 μm or less, and even more preferably 0.5 μm or less. For example, distances between the exposed surfaces (91b) and the surface (80a) of the resin 80 indicate the sizes of the steps 28.

The flat parts (91a) of the first inorganic particles 91 substantially coincide with a surface obtained by extending the surface (80a) of the resin 80 formed around the first inorganic particles 91 (a surface that forms the inner wall surface (27F)). The flat parts (91a) drawn with substantially straight lines in FIGS. 1 and 2A each mean a flat surface. In the cross sections illustrated in FIGS. 1 and 2A, the flat parts (91a) are each a flat surface. It is also possible that the flat parts (91a) are not each a perfect flat surface. The flat parts (91a) are each substantially a flat surface and are each substantially a smooth surface.

Figure 2B:
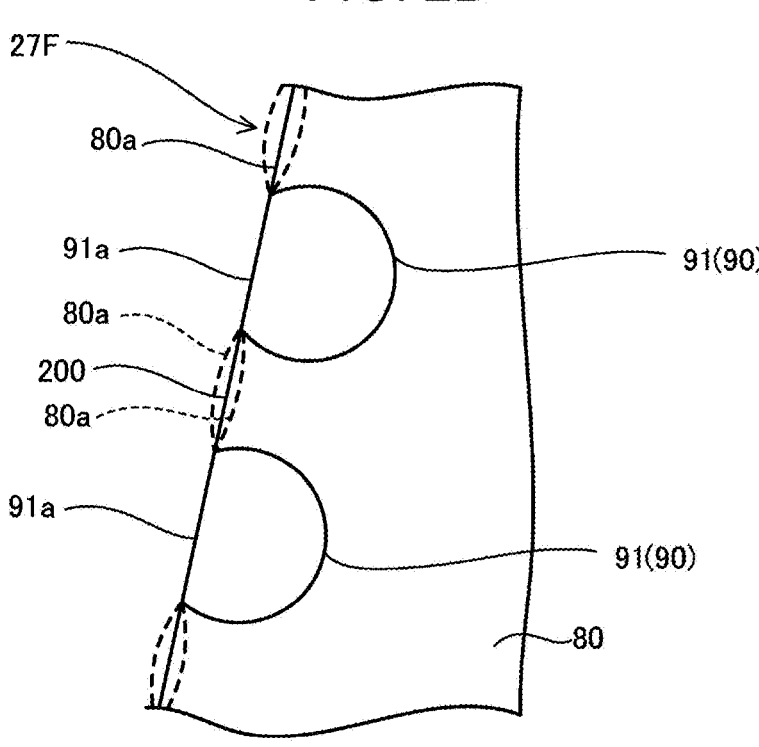
FIG. 2B is an enlarged cross-sectional view schematically illustrating a part of an inner wall surface.

FIG. 2B is an enlarged cross-sectional view illustrating a part of the inner wall surface (27F) in FIG. 2A. As illustrated in FIG. 2B, with respect to a reference surface 200 connecting the flat parts (91a) of two first inorganic particles 91 forming the inner wall surface (27F), the surface (80a) of the resin 80 positioned between the two first inorganic particles 91 may be concave or convex (see the dashed lines). Preferably, there are no other first inorganic particles 91 between the two first inorganic particles 91 that form the reference surface 200. A distance between the reference surface 200 and the surface (80a) of the resin 80 may be used as a representative value of the sizes of the steps 28.

As illustrated in FIG. 2A, the inner wall surface (27F) of each of the first openings (26F) is inclined. An angle (inclination angle) (θ1) between the front surface (5F) of the substrate 4 and the inner wall surface (27F) is 70 degrees or more and 85 degrees or less. An angle (inclination angle) (θ2) between the first surface (22F) of the first resin insulating layer (20F) and the inner wall surface (27F) is 95 degrees or more and 110 degrees or less.

In the cross-sections illustrated in FIGS. 1 and 2A, the first openings (26F) are illustrated to each have a substantially inverted trapezoidal shape. However, the actual first openings (26F) each have a substantially inverted truncated cone shape. Therefore, the actual inner wall surface (side wall) (27F) of each of the first openings (26F) is a substantially curved surface. That is, the common surface formed by the flat parts (91a) and the resin 80 includes the inner wall surface (side wall) (27F) formed as a substantially curved surface.

As illustrated in FIG. 1, the first conductor layer (30F) is formed on the first surface (22F) of the first resin insulating layer (20F). The first conductor layer (30F) includes a first signal wiring (32F), a second signal wiring (34F), and lands (36F). Although not illustrated in the drawings, the first conductor layer (30F) also includes conductor circuits other than the first signal wiring (32F), the second signal wiring (34F), and the lands (36F). The first signal wiring (32F) and the second signal wiring (34F) form a pair wiring. The first conductor layer (30F) is mainly formed of copper. The first conductor layer (30F) is formed of a seed layer (30Fa) and an electrolytic plating layer (30Fb) on the seed layer (30Fa). The seed layer (30Fa) is formed by sputtering. The seed layer (30Fa) is formed of a first layer (31Fa) on the first surface (22F) and a second layer (31Fb) on the first layer (31Fa). The first layer (31Fa) is in contact with the first surface (22F). The second layer (31Fb) is not essential.

The first layer (31Fa) is formed of an alloy containing copper, aluminum, and a specific metal. Examples of the specific metal include nickel, zinc, gallium, silicon, and magnesium. The alloy preferably contains one type of specific metal, or two types of specific metals, or three types of specific metals. A content of aluminum in the alloy is 1.0 at % or more and 15.0 at % or less. An example of the specific metal is silicon. A content of the specific metal in the alloy is 0.5 at % or more and 10.0 at % or less. The first layer (31Fa) may contain impurities. Examples of the impurities include oxygen and carbon. The first layer (31Fa) can contain oxygen or carbon. The first layer (31Fa) can contain oxygen and carbon. In the embodiment, the alloy further contains carbon. A content of carbon in the alloy is 50 ppm or less. The alloy further contains oxygen. A content of oxygen in the alloy is 100 ppm or less. The values of the contents of the elements described above are examples. Among the elements forming the first layer (31Fa), copper has the largest content. The content of aluminum is the next largest. The content of the specific metal is less than the content of aluminum. Therefore, copper is a primary metal, aluminum is a first secondary metal, and the specific metal is a second secondary metal. A content of the impurities is smaller than the content of the specific metal. The first layer (31Fa) is formed of a copper alloy.

The second layer (31Fb) is formed of copper. A content of copper forming the second layer (31Fb) is 99.9 at % or more. The content of copper in the second layer (31Fb) is preferably 99.95 at % or more. The seed layer (30Fa) is formed of a copper alloy. The electrolytic plating layer (30Fb) is formed of copper. A content of copper forming the electrolytic plating layer (30Fb) is 99.9 at % or more. The content of copper in the electrolytic plating layer (30Fb) is preferably 99.95 at % or more.

The first resin insulating layer (20F) is formed on the glass substrate 4. Since glass is excellent in flatness, the first surface (22F) of the first resin insulating layer (20F) is also excellent in flatness. When no conductor circuit is formed between the front surface (5F) and the first resin insulating layer (20F), the first surface (22F) can follow the front surface (5F). The first surface (22F) can have similar flatness as the front surface (5F). In the embodiment, fine wirings can be formed on the first surface (22F). For example, the first conductor layer (30F) can have wirings having widths of 1.5 μm or more and 3.5 μm or less. A width of a space between adjacent wirings is 1.5 μm or more and 3.5 μm or less.

The first via conductors (40F) are respectively formed in the first openings (26F). The first via conductors (40F) electrically connect the through-hole conductors 8 to the first conductor layer (30F). The first via conductors (40F) electrically connect the through-hole conductors 8 to the lands (36F) of the first via conductors (40F). The first via conductors (40F) are formed of a seed layer (30Fa) and an electrolytic plating layer (30Fb) on the seed layer (30Fa). The seed layer (30Fa) forming the first via conductors (40F) and the seed layer (30Fa) forming the first conductor layer (30F) are common. The electrolytic plating layer (30Fb) forming the first via conductors (40F) and the electrolytic plating layer (30Fb) forming the first conductor layer (30F) are common. The seed layer (30Fa) forming the first via conductors (40F) is formed of a first layer (31Fa), which is formed on the inner wall surfaces (27F) of the first openings (26F) and on the upper ends (8F) of the through-hole conductors 8 exposed from the first openings (26F), and a second layer (31Fb) on the first layer (31Fa). In FIG. 1, the first via conductors (40F) are respectively connected to the upper ends (8F). The first layer (31Fa) is in contact with the upper ends (8F) of the through-hole conductors 8 and the inner wall surfaces (27F). The first via conductors (40F) are respectively directly formed on the upper ends (8F).

Figure 2C:
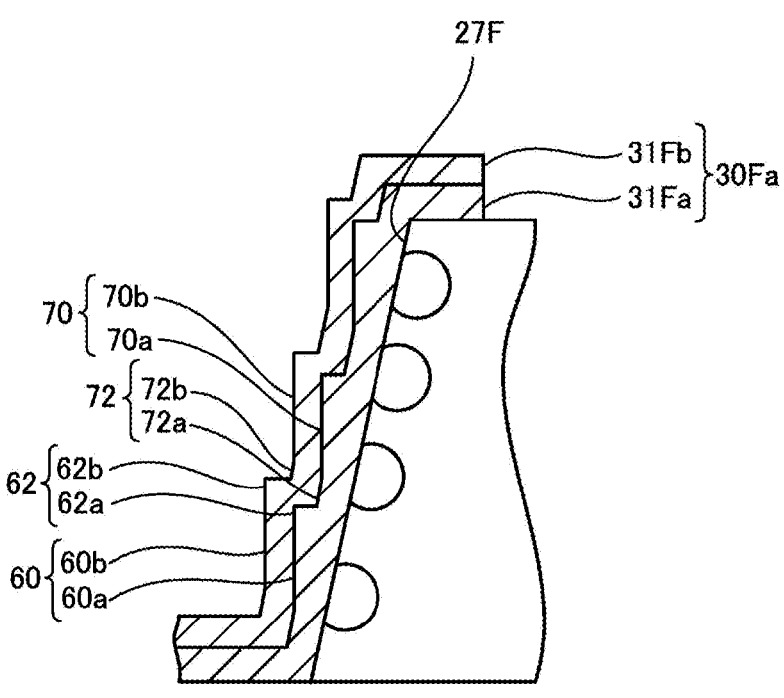
FIG. 2C is an enlarged cross-sectional view schematically illustrating a part of a seed layer.

FIG. 2C is an enlarged cross-sectional view schematically illustrating a part of the seed layer (30Fa) on the inner wall surface (27F) of FIG. 2A. FIG. 3 shows an example of the seed layer (30Fa). The seed layer (30Fa) on the inner wall surface (27F) is in contact with the inner wall surface (27F). As shown in FIGS. 2A, 2C and 3, the seed layer (30Fa) forming the first via conductors (40F) has a substantially smooth first portion 60 and a substantially smooth second portion 70. The first portion 60 and the second portion 70 are electrically connected. The first portion 60 and second portion 70 are continuous. As shown in FIG. 3, a part of the first portion 60 is formed on the second portion 70. A leading end 62 of the first portion 60 is formed on a trailing end 72 of the second portion 70. The first portion 60 and the second portion 70 are formed at the same time. The seed layer (30Fa) covering the inner wall surface (27F) has a substantially step-shaped cross section.

As illustrated in FIG. 2C, the first layer (31Fa) of the seed layer (30Fa) has a first portion (60a) and a second portion (70a). The first portion (60a) and the second portion (70a) are electrically connected. The first portion (60a) and the second portion (70a) are continuous. A leading end (62a) of the first portion (60a) is formed on a trailing end (72a) of the second portion (70a). The first layer (31Fa) covering the inner wall surface (27F) has a substantially step-shaped cross section. The first layer (31Fa) on the inner wall surface (27F) is in contact with the inner wall surface (27F).

The second layer (31Fb) of the seed layer (30Fa) has a first portion (60b) and a second portion (70b). The first portion (60b) and the second portion (70b) are electrically connected. A leading end (62b) of the first portion (60b) is formed on a trailing end (72b) of the second portion (70b). The second layer (31Fb) formed on the inner wall surface (27F) has a substantially step-shaped cross section.

In the embodiment, a part of the first portion 60 is laminated on the second portion 70. A part of the first portion 60 overlaps the second portion 70. The leading end 62 of the first portion 60 is laminated on the trailing end 72 of the second portion 70. The leading end 62 of the first portion 60 overlaps the trailing end 72 of the second portion 70.

The inner wall surface (27F) of the embodiment is formed as a substantially smooth surface. When the first layer (31Fa) follows the shape of the inner wall surface (27F), the first layer (31Fa) on the inner wall surface (27F) has a substantially smooth surface. The first layer (31Fa) has a linear cross-sectional shape. The seed layer (30Fa) on the inner wall surface (27F) has a substantially smooth surface. The seed layer (30Fa) has a linear cross-sectional shape. In this case, the electrolytic plating layer (30Fb) forming the first via conductors (40F) is formed on a smooth surface. For example, when the wiring substrate 2 is subjected to a large impact, peeling occurs between the first layer (31Fa) on the inner wall surface (27F) and the second layer (31Fb) on the first layer (31Fa). Or, peeling occurs between the seed layer (30Fa) on the inner wall surface (27F) and the electrolytic plating layer (30Fb) forming the first via conductors (40F). In contrast, the seed layer (30Fa) and the first layer (31Fa) in the embodiment each have a step-shaped cross section. Therefore, peeling is unlikely to occur.

When the openings for the via conductors expose the front surface (5F), the first layer (31Fa) is in contact with the glass substrate 4. The openings of the first example and the openings of the second example expose the front surface (5F). Further, the openings of the first example and the openings of the second example expose the upper ends (8F). Since the first layer (31Fa) contains aluminum and glass contains oxygen, it is thought that bonding strength between the first layer (31Fa) and the substrate 4 is increased. Further, when the first layer (31Fa) contains silicon, the first layer (31Fa) and the substrate 4 contain the same element (silicon). It is thought that the bonding strength between the first layer (31Fa) and the substrate 4 is further increased. When a part of the seed layer forming the via conductors is in contact with the glass substrate 4, the via conductors are unlikely to peel off from the through-hole conductors 8 even when the wiring substrate 2 is subjected to a thermal shock. The seed layer (for example, the first layer (31Fa)) forming the via conductors that is in contact with the upper ends (8F) is preferably in contact with both the upper ends (8F) and the front surface (5F). Similarly, the seed layer (for example, the first layer) forming the via conductors that is in contact with the lower ends (8B) is preferably in contact with both the lower ends (8B) and the back surface (5B). When an adhesive layer for bonding a resin insulating layer such as the first resin insulating layer (20F) and the substrate 4 is formed between the front surface (5F) and the second surface (24F), the adhesive layer may be a part of the resin insulating layer. The adhesive layer is included in the resin insulating layer. The adhesive layer includes an organic adhesive layer and an inorganic adhesive layer. The adhesive layer is formed of an insulating material.

The second resin insulating layer (120F) is formed on the first surface (22F) of the first resin insulating layer (20F) and on the first conductor layer (30F). The first conductor layer (30F) is formed between the second resin insulating layer (120F) and the first resin insulating layer (20F). The second resin insulating layer (120F) has a first surface (122F) and a second surface (124F) on the opposite side with respect to the first surface (122F). The second surface (124F) of the second resin insulating layer (120F) faces the first conductor layer (30F). Similar to the first resin insulating layer (20F), the second resin insulating layer (120F) is formed of a resin 80 and inorganic particles 90 (first inorganic particles 91 and second inorganic particles 92). Therefore, the material of the second resin insulating layer (120F) is similar to the material of the first resin insulating layer (20F). The first surface (122F) of the second resin insulating layer (120F) is similar to the first surface (22F) of the first resin insulating layer (20F).

The second resin insulating layer (120F) has second openings (126F) that expose the first conductor layer (30F). The second openings (126F) respectively expose the lands (36F). The second openings (126F) each have an inner wall surface (127F). The first openings (26F) and the second openings (126F) are similar. Therefore, the inner wall surface (27F) of each of the first openings (26F) and the inner wall surface (127F) of each of the second openings (126F) are similar.

The second conductor layer (130F) is formed on the first surface (122F) of the second resin insulating layer (120F). The second conductor layer (130F) includes a first signal wiring (132F), a second signal wiring (134F), and lands (136F). Although not illustrated in the drawings, the second conductor layer (130F) also includes conductor circuits other than the first signal wiring (132F), the second signal wiring (134F), and the lands (136F). The first signal wiring (132F) and the second signal wiring (134F) form a pair wiring. The second conductor layer (130F) and the first conductor layer (30F) are similar. Therefore, the second conductor layer (130F) is formed of a seed layer (130Fa) and an electrolytic plating layer (130Fb) on the seed layer (130Fa). The seed layer (130Fa) is formed of a first layer (131Fa) and a second layer (131Fb) on the first layer (131Fa). The first layer (131Fa) forming the second conductor layer (130F) is similar to the first layer (31Fa) forming the first conductor layer (30F). The second layer (131Fb) forming the second conductor layer (130F) is similar to the second layer (31Fb) forming the first conductor layer (30F). The electrolytic plating layer (130Fb) forming the second conductor layer (130F) is similar to the electrolytic plating layer (30Fb) forming the first conductor layer (30F).

The second via conductors (140F) are respectively formed in the second openings (126F). The second via conductors (140F) electrically connect the first conductor layer (30F) and the second conductor layer (130F). In FIG. 1, the second via conductors (140F) respectively electrically connect the lands (36F) to the lands (136F). The second via conductors (140F) and the first via conductors (40F) are similar. Therefore, the second via conductors (140F) are formed of a seed layer (130Fa) and an electrolytic plating layer (130Fb) on the seed layer (130Fa). The seed layer (130Fa) is formed of a first layer (131Fa) and a second layer (131Fb) on the first layer (131Fa). The first layer (131Fa) forming the second via conductors (140F) and the first layer (131Fa) forming the second conductor layer (130F) are common. The second layer (131Fb) forming the second via conductors (140F) and the second layer (131Fb) forming the second conductor layer (130F) are common. The electrolytic plating layer (130Fb) forming the second via conductors (140F) and the electrolytic plating layer (130Fb) forming the second conductor layer (130F) are common.

The back side build-up layer (300B) includes back side resin insulating layers, back side conductor layers, and back side via conductors that penetrate the back side resin insulating layers. The back side resin insulating layers and the back side conductor layers are alternately laminated. The back side conductor layers and the back side via conductors are electrically connected to the through-hole conductors 8. The back side resin insulating layers in FIG. 1 are a first resin insulating layer (20B) having a first surface (22B) and a second surface (24B) and a second resin insulating layer (120B) having a first surface (122B) and a second surface (124B). The back side conductor layers are a first conductor layer (30B) and a second conductor layer (130B). The first conductor layer (30B) and the second conductor layer (130B) include first signal wirings (32B, 132B) and second signal wirings (34B, 134B). The back side via conductors are first via conductors (40B) and second via conductors (140B).

The front side build-up layer (300F) and the back side build-up layer (300B) are similar. Therefore, the front side resin insulating layers forming the front side build-up layer (300F) and the back side resin insulating layers forming the back side build-up layer (300B) are similar. The back side resin insulating layers are each formed of a resin 80 and inorganic particles 90. The back side resin insulating layers contain the first inorganic 91 and the second inorganic particles 92. The first surface of each of the resin insulating layers is formed only of the resin. The front side conductor layers and the back side conductor layers are similar. The openings for the front side via conductors and the openings for the back side via conductors are similar. The inner wall surface of each of the openings for the via conductors is formed of the surface (exposed surface) (80a) of the resin 80 and the exposed surfaces (91b) of the inorganic particles. The front side via conductors and the back side via conductors are similar.

Although not illustrated in the drawings, each side of the wiring substrate 2 has a length of 50 mm or more. The length of each side is preferably 100 mm or more. The length of each side is 250 mm or less. A length of a signal wiring formed according to the embodiment is 5 mm or more. The length of the signal wiring may be 10 mm or more and 20 mm or less.

Method for Manufacturing Wiring Substrate

Figure 4B:
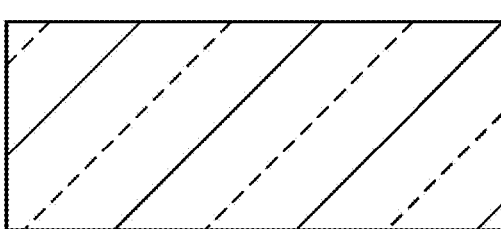
FIG. 4B is a cross-sectional view schematically illustrating a method for manufacturing a wiring substrate according to an embodiment of the present invention.
Figure 4B:
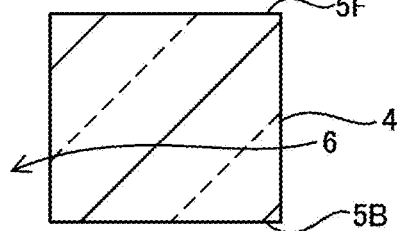
Figure 4C:
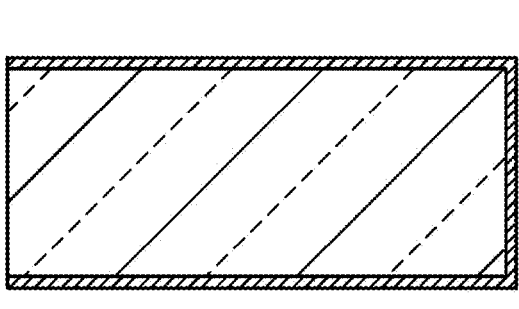
FIG. 4C is a cross-sectional view schematically illustrating a method for manufacturing a wiring substrate according to an embodiment of the present invention.
Figure 4C:
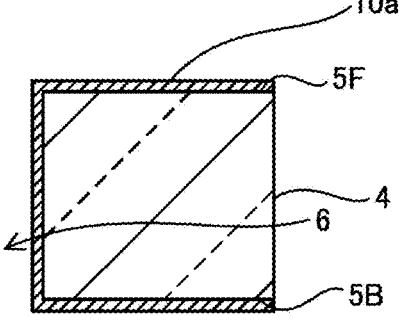
Figure 4D:
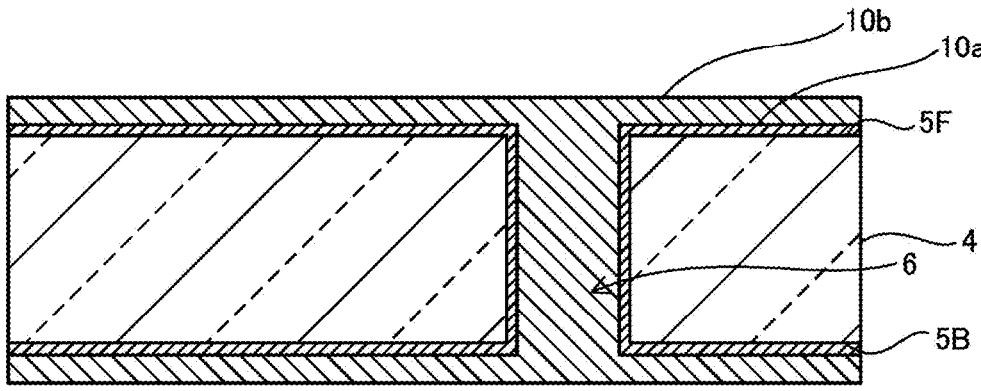
FIG. 4D is a cross-sectional view schematically illustrating a method for manufacturing a wiring substrate according to an embodiment of the present invention.
Figure 4E:
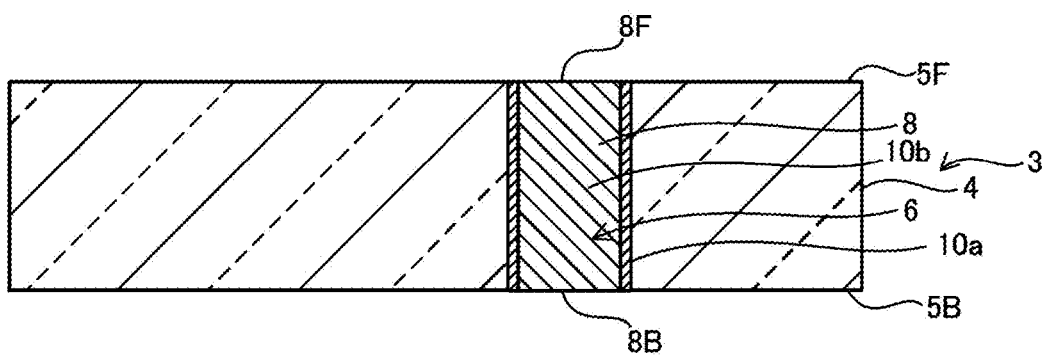
FIG. 4E is a cross-sectional view schematically illustrating a method for manufacturing a wiring substrate according to an embodiment of the present invention.
Figure 4F:
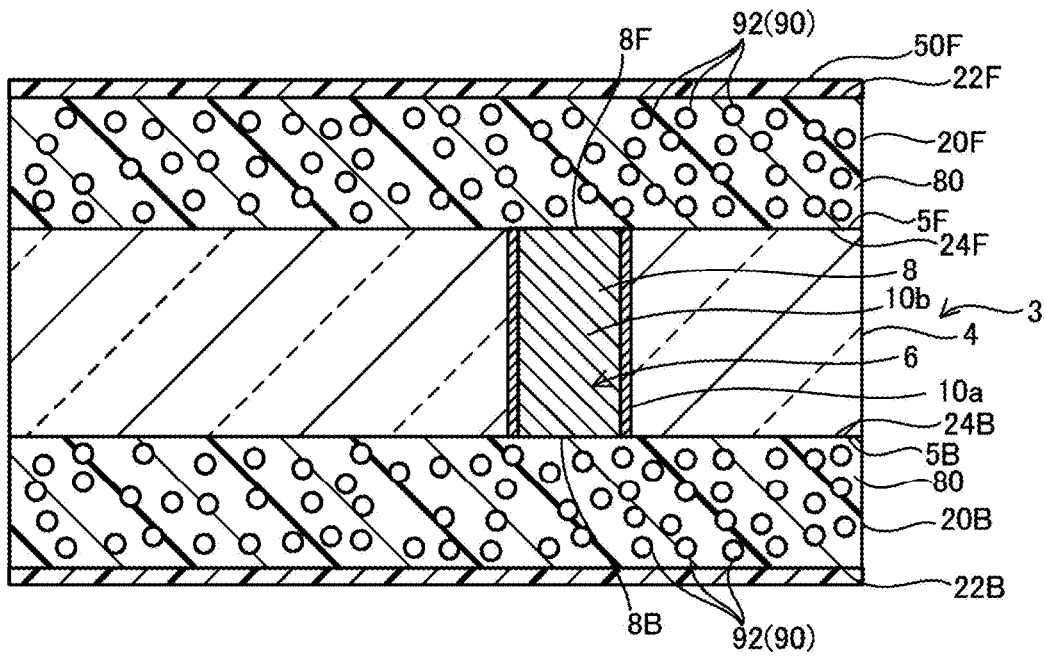
FIG. 4F is a cross-sectional view schematically illustrating a method for manufacturing a wiring substrate according to an embodiment of the present invention.
Figure 4G:
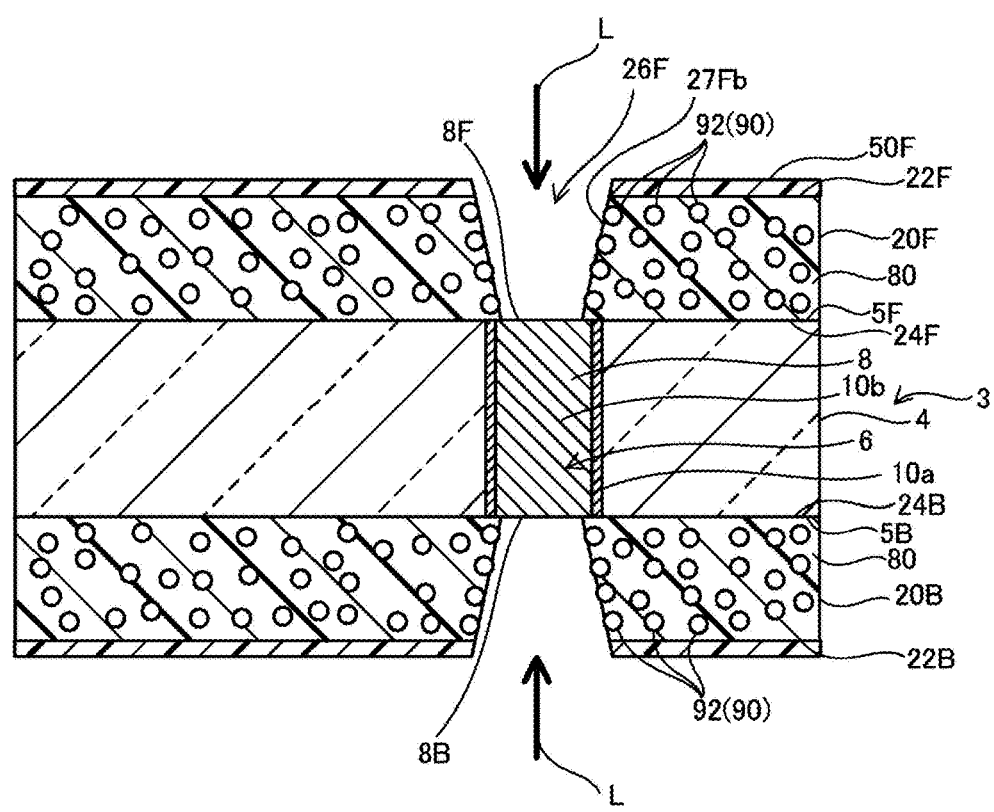
FIG. 4G is a cross-sectional view schematically illustrating a method for manufacturing a wiring substrate according to an embodiment of the present invention.
Figure 4H:
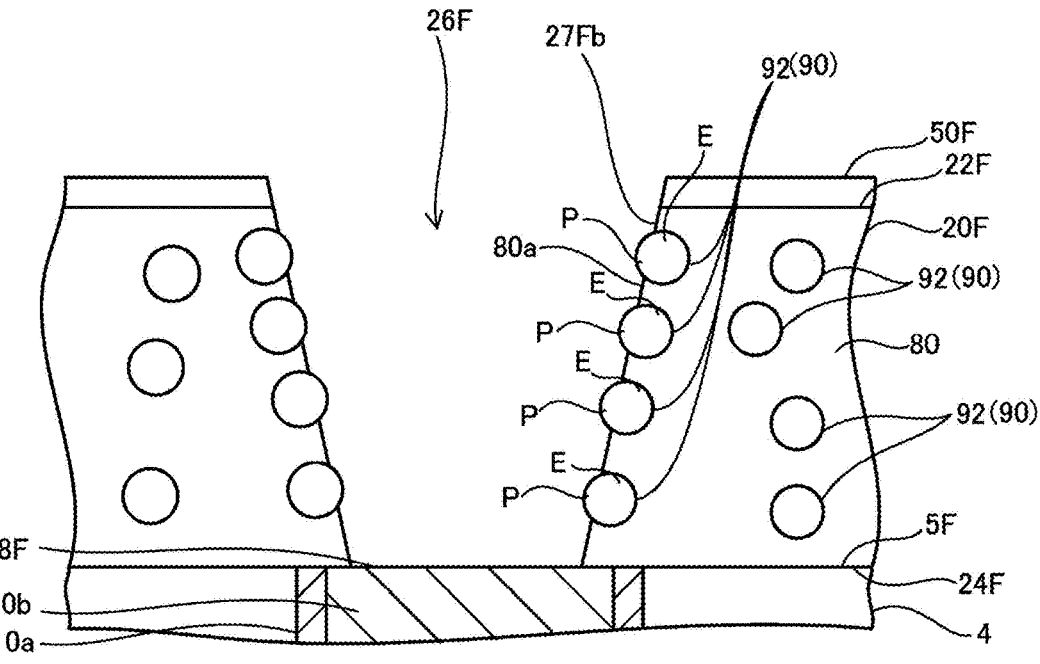
FIG. 4H is an enlarged cross-sectional view schematically illustrating a method for manufacturing a wiring substrate according to an embodiment of the present invention.
Figure 4I:
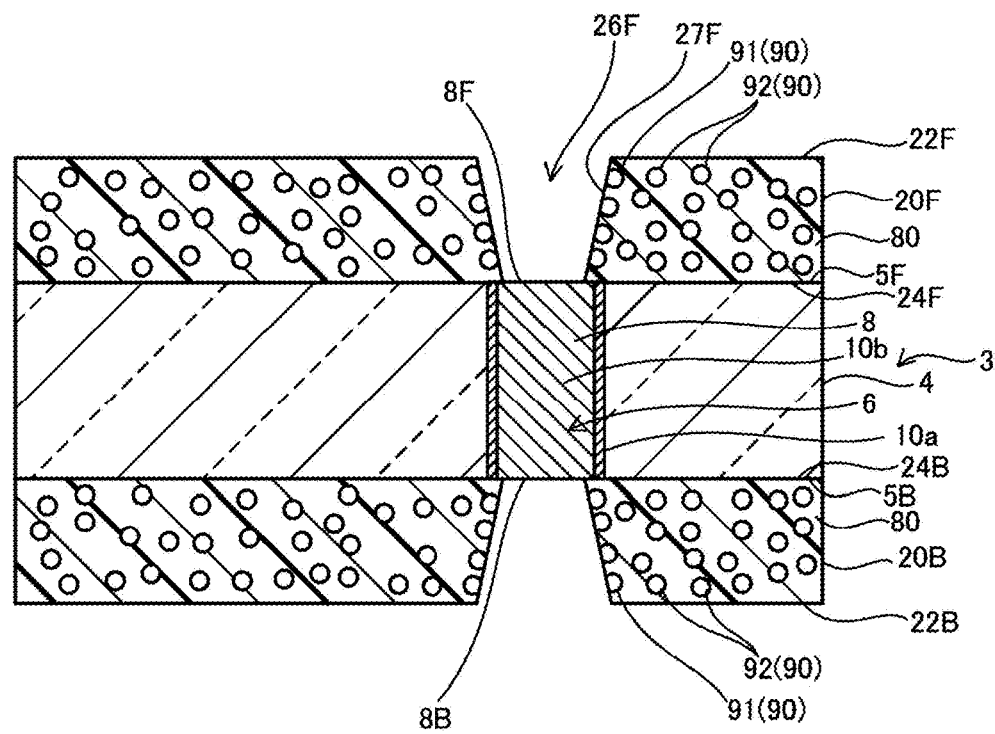
FIG. 4I is a cross-sectional view schematically illustrating a method for manufacturing a wiring substrate according to an embodiment of the present invention.
Figure 4J:
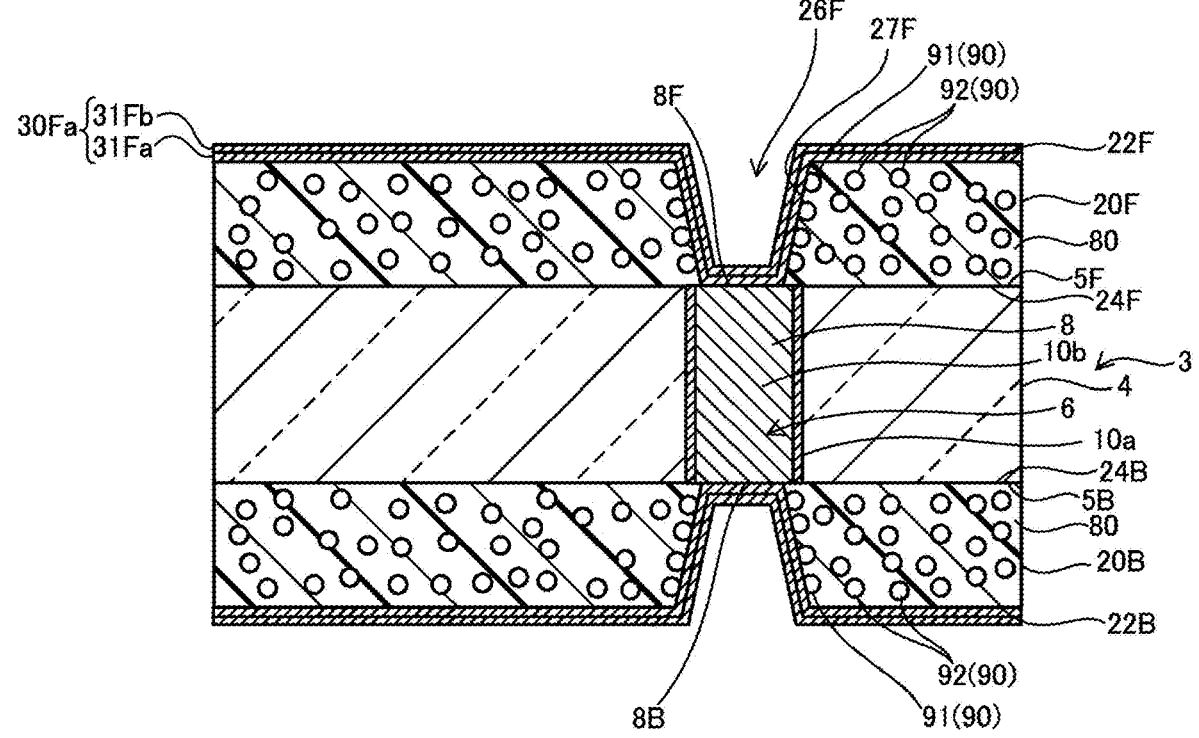
FIG. 4J is a cross-sectional view schematically illustrating a method for manufacturing a wiring substrate according to an embodiment of the present invention.
Figure 4K:
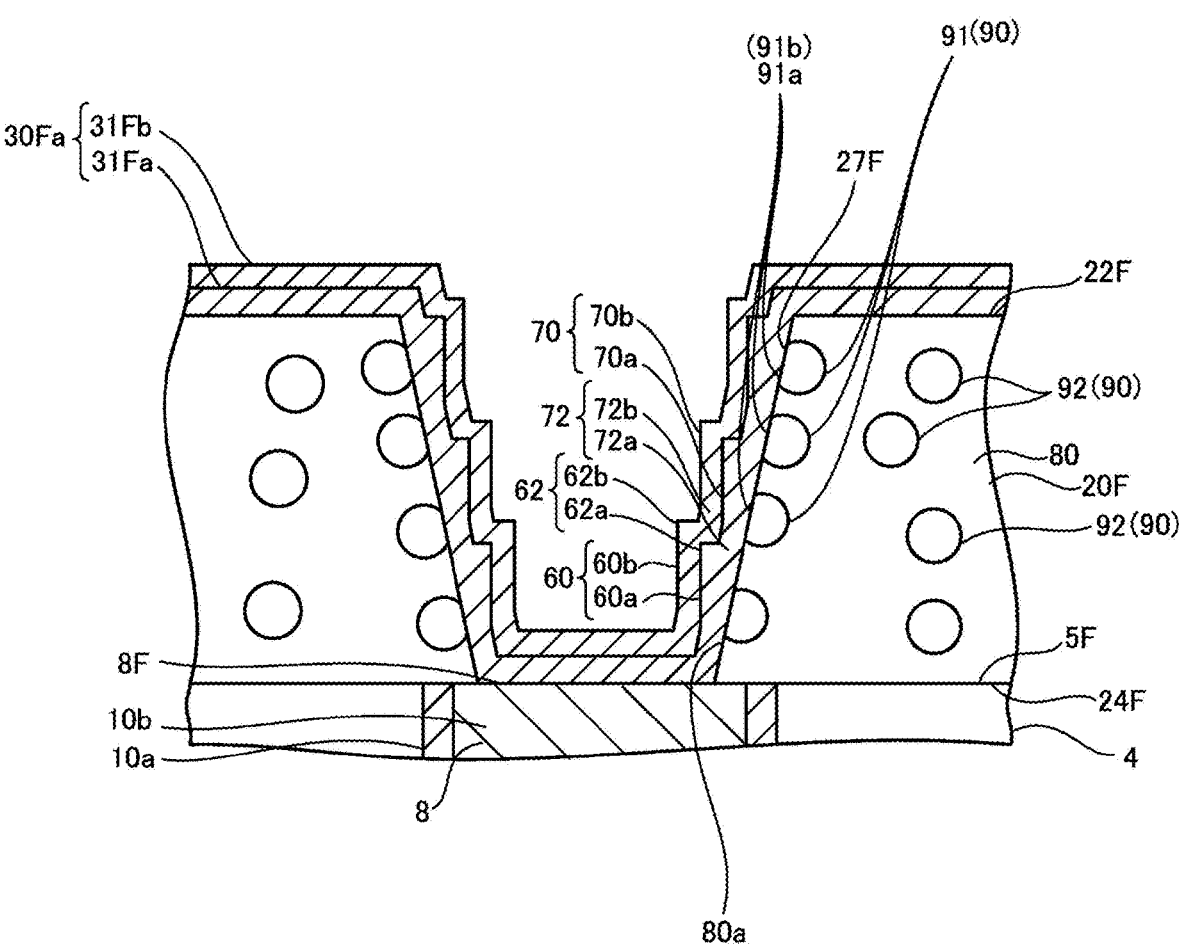
FIG. 4K is an enlarged cross-sectional view schematically illustrating a method for manufacturing a wiring substrate according to an embodiment of the present invention.

FIGS. 4A-4K illustrate a method for manufacturing the wiring substrate 2 of the embodiment. FIGS. 4A-4G and 4I-4J are cross-sectional views. FIGS. 4H and 4K are enlarged cross-sectional views. FIG. 4A illustrates the glass substrate 4. The substrate 4 has the front surface (5F) and the back surface (5B). As illustrated in FIG. 4B, the through holes 6 each extending from the front surface (5F) to the back surface (5B) are formed. The through holes 6 penetrate the substrate 4. Laser is irradiated from the front surface (5F) side of the substrate 4. After that, the substrate 4 is immersed in a hydrofluoric acid. The through holes 6 are formed.

As illustrated in FIG. 4C, the seed layer (10a) is formed. The seed layer (10a) is formed by electroless plating. The seed layer (10a) is formed on the inner wall surfaces of the through holes 6, on the front surface (5F), and on the back surface (5B).

As illustrated in FIG. 4D, the electrolytic plating layer (10b) is formed. The electrolytic plating layer (10b) is formed on the seed layer (10a). The electrolytic plating layer (10b) fills the through holes 6.

As illustrated in FIG. 4E, the electrolytic plating layer (10b) and the seed layer (10a) on the front surface (5F) are removed by polishing. The electrolytic plating layer (10b) and the seed layer (10a) on the back surface (5B) are removed by polishing. The front surface (5F) and the back surface (5B) of the substrate 4 are exposed. The through-hole conductors 8 are formed by the seed layer (10a) on the inner wall surfaces of the through holes 6 and the electrolytic plating layer (10b) on the seed layer (10a). The upper ends (8F) of the through-hole conductors 8 are exposed from the front surface (5F). The lower ends (8B) of the through-hole conductors 8 are exposed from the back surface (5B). Surfaces forming the upper ends (8F) and the front surface (5F) form the same flat surface. Surfaces forming the lower ends (8B) and the back surface (5B) form the same flat surface. The core substrate 3 (FIG. 1) is formed. The core substrate 3 in FIG. 1 has no conductor circuit on the front surface (5F). The core substrate 3 in FIG. 1 has no conductor circuit on the back surface (5B).

The front side build-up layer (300F) and the back side build-up layer (300B) are formed on core substrate 3 using similar methods. The method for forming the front side build-up layer (300F) is described below. The back side build-up layer (300B) is also depicted in the drawings.

As illustrated in FIG. 4F, the first resin insulating layer (20F) and a protective film (50F) are formed on the front surface (5F) of the substrate 4 and on the upper ends (8F). The second surface (24F) of the first resin insulating layer (20F) faces the front surface (5F) of the substrate 4. The protective film (50F) is formed on the first surface (22F) of the first resin insulating layer (20F). The first surface (22F) of the first resin insulating layer (20F) is formed only of the resin 80. No inorganic particles 90 are exposed from the first surface (22F). The first surface (22F) does not include surfaces of the inorganic particles 90. No unevenness is formed on the first surface (22F) of the first resin insulating layer (20F). The first resin insulating layer (20F) is formed on a flat surface formed by the front surface (5F) and the upper ends (8F). Therefore, the first surface (22F) is formed as a substantially flat surface. The front surface (5F) and the first surface (22F) are substantially parallel.

As illustrated in FIG. 4G, laser (L) is irradiated from above the protective film (50F). The laser (L) penetrates the protective film (50F) and the first resin insulating layer (20F) at the same time. The first openings (26F) for the via conductors reaching the upper ends (8F) of the through-hole conductors 8 are formed. The laser (L) is, for example, UV laser, or $CO_2$ laser. The upper ends (8F) of the through-hole conductors 8 are exposed from the first openings (26F). When the first openings (26F) are formed, the first surface (22F) is covered by the protective film (50F). When the first openings (26F) are formed, even when the resin scatters, adherence of the resin to the first surface (22F) is suppressed.

The first surface (22F) is excellent in flatness. When the laser (L) is irradiated to the first surface (22F), the laser (L) is unlikely to be diffusely reflected. When each of the first openings (26F) is formed, a focus position of the laser (L) is likely to match. Openings for via conductors with small diameters can be formed. The diameters of the openings for the via conductors are substantially equal to each other. For example, openings for via conductors having diameters of 15 μm or more and 35 μm or less can be formed. The diameters are measured on the first surface (22F).

FIG. 4H illustrates an inner wall surface (27Fb) of each of the first openings (26F) after the laser irradiation. The inner wall surface (27Fb) is formed of the resin 80 and the inorganic particles 90 protruding from the resin 80. In order to control a shape of the inner wall surface, the inner wall surface (27Fb) after the laser irradiation is treated. It is preferable to selectively remove the inorganic particles 90 protruding from the resin 80. As a result, the first inorganic particles 91 are formed from the inorganic particles 90. For example, the inorganic particles 90 protruding from the resin 80 are selectively removed by treating the inner wall surface (27Fb) after the laser irradiation with a chemical. Or, the inorganic particles 90 protruding from the resin 80 are selectively removed by treating the inner wall surface (27Fb) after the laser irradiation with plasma. The selectively removing includes that an etching rate of the inorganic particles 90 is greater than an etching rate of the resin 80. For example, a difference in etching rate between the two is 10 or more times. Or, the difference in etching rate between the two is 50 or more times. Or, the difference in etching rate between the two is 100 or more times. By treating the inner wall surface (27Fb) after the laser irradiation, the first inorganic particles 91 having the flat parts (91a) (see FIG. 2A) are obtained. By controlling conditions for treating the inner wall surface (27Fb) after the laser irradiation, the shape of the inner wall surface (27F) can be controlled. Examples of the conditions are a temperature, a concentration, a time, a type of gas, and a pressure. The etching rate of the inorganic particles 90 and the etching rate of the resin are controlled.

By irradiating the first resin insulating layer (20F) with the laser (L), some of the second inorganic particles 92 embedded in the resin 80 form the inner wall surface (27Fb) after the laser irradiation. The second inorganic particles 92 forming the inner wall surface (27Fb) after the laser irradiation are each formed of a protruding portion (P) protruding from the resin 80 and a portion (E) embedded in the resin 80. The inner wall surface (27Fb) after the laser irradiation is treated. For example, the inner wall surface (27Fb) is treated with plasma of a gas containing tetrafluoromethane. The protruding portions (P) are selectively removed and the inner wall surface (27F) of the embodiment (FIGS. 1 and 2A) is formed. The first inorganic particles 91 are formed from the second inorganic particles 92. By selectively removing the protruding portions (P), the first inorganic particles 91 having the flat parts (91a) are formed. The flat parts (91a) are flat surfaces. When the second inorganic particles 92 having spherical shapes are cut along a flat surface, the shapes of the first inorganic particles 91 are obtained. The inner wall surface (27F) is formed of the flat parts (91a) and the surface (80a) of the resin 80, and exposed surfaces (91b) of the flat parts (91a) and the surface (80a) of the resin 80 are substantially positioned on the same flat surface. As shown in FIG. 3, the steps 28 are formed at the boundary parts between the surface (80a) of the resin 80 that forms the inner wall surface (27F) and the flat parts (91a) of the first inorganic particles 91. For example, when the seed layer (30Fa) is formed on the inner wall surface (27Fb) by sputtering, the protruding portions (P) inhibit growth of a sputtered film (sputtering-deposited film). For example, a continuous seed layer (30Fa) is not formed on the inner wall surface (27Fb). Or, the thickness of the seed layer (30Fa) is increased. A fine conductor circuit cannot be formed. In the embodiment, the projecting portions (P) are removed. The thickness of the seed layer (30Fa) formed by sputtering can be reduced. Even when the seed layer (30Fa) formed by sputtering is thin, a continuous seed layer (30Fa) can be obtained. When the steps 28 are present, the surface (80a) of the resin is preferably recessed from the exposed surfaces (91b) of the flat parts (91a). It is also possible that the surface (80a) of the resin protrudes from the exposed surfaces (91b) of the flat parts (91a).

Forming the first openings (26F) includes forming the inorganic particles 90 (the second inorganic particles 92) having the protruding portions (P). The protruding portions (P) protrude from the resin 80 that forms the inner wall surface (27Fb) of each of the first openings (26F). The first inorganic particles 91 are formed by removing the protruding portions (P) of the inorganic particles 90 (the second inorganic particles 92). The inner wall surface (27F) of each of the first openings (26F) includes the exposed surfaces (91b) of the first inorganic particles 91. The exposed surfaces (91b) of the first inorganic particles 91 are formed by removing the protruding portions (P).

Obtaining the shapes of the first inorganic particles 91 by cutting the second inorganic particles 92 having spherical shapes along a flat surface includes removing the protruding portions (P) of the inorganic particles 90. The actual inner wall surface (27F) of each of the first openings (26F) is a substantially curved surface. Since the flat parts (91a) are formed by removing the protruding portions (P), the exposed surfaces (91b) of the flat parts (91a) each include a curved surface. That is, forming a common surface with the flat parts (91a) and the resin 80 includes forming the inner wall surface (27F) formed with a substantially curved surface.

No unevenness is formed on the inner wall surface (27F). The inner wall surface (27F) is formed smooth. As shown in FIG. 3, the steps 28 are formed at the boundary parts between the surface (80a) of the resin 80 that forms the inner wall surface (27F) and the flat parts (91a) of the first inorganic particles 91. The distances between the exposed surfaces (91b) and the surface (80a) of the resin 80 can represent the sizes of the steps 28. The sizes of the steps 28 are preferably 3.0 μm or less, more preferably 1.5 μm or less, and even more preferably 0.5 μm or less. The exposed surfaces (91b) are recessed from the surface (80a) of the resin 80. Or, the exposed surfaces (91b) protrude from the surface (80a) of the resin 80. Even when the steps 28 are formed, since the steps 28 are small, the exposed surfaces (91b) and the surface (80a) of the resin 80 form a substantially common surface. By controlling the conditions for treating the inner wall surface (27Fb) after the laser irradiation, a size of unevenness or the sizes of the steps 28 are controlled.

Insides of the first openings (26F) are cleaned. By cleaning the insides of the first openings (26F), resin residues generated when the first openings (26F) are formed are removed. The cleaning of the insides of the first openings (26F) is performed using plasma. That is, the cleaning is performed with a dry process. The cleaning includes a desmear treatment.

When the insides of the first openings (26F) are cleaned, the first surface (22F) of the resin insulating layer (20F) is covered by the protective film (50F). The first surface (22F) is not affected by the plasma. The first surface (22F) is formed only of the resin 80. No inorganic particles 90 are exposed from the first surface (22F). The first surface (22F) does not include surfaces of the inorganic particles 90. The first surface (22F) of the first resin insulating layer (20F) has no unevenness. The first surface (22F) is formed smooth.

When treating the inner wall surface (27Fb) after the laser irradiation includes cleaning the insides of the first openings (26F), cleaning the insides of the first openings (26F) can be omitted.

As illustrated in FIG. 4I, after cleaning the insides of the first openings (26F), the protective film (50F) is removed from the first resin insulating layer (20F). When treating the inner wall surface (27Fb) after the laser irradiation includes cleaning the insides of the first openings (26F), the protective film (50F) is removed from the first resin insulating layer (20F) after treating the inner wall surface (27Fb) after the laser irradiation. When the inner wall surface (27Fb) after the laser irradiation is treated, the protective film (50F) covers the first surface (22F) of the first resin insulating layer (20F). After the protective film (50F) is removed, the first surface (22F) of the first resin insulating layer (20F) is not roughened.

As illustrated in FIG. 4J, the seed layer (30Fa) is formed on the first surface (22F) of the first resin insulating layer (20F). The seed layer (30Fa) is formed by sputtering. The formation of the seed layer (30Fa) is performed with a dry process. The seed layer (30Fa) is also formed on the upper ends (8F) of the through-hole conductors 8 exposed from the first openings (26F) and on the inner wall surfaces (27F) of the first openings (26F). The seed layer (30Fa) is mainly formed of copper. The first layer (31Fa) is formed on the first surface (22F) by sputtering. The first layer (31Fa) is formed by sputtering on the inner wall surfaces (27F) exposed from the first openings (26F) and on the upper ends (8F) of the through-hole conductors 8. The second layer (31Fb) is formed on the first layer (31Fa) by sputtering. The first layer (31Fa) is formed of an alloy containing copper, aluminum, and a specific metal (for example, silicon). The second layer (31Fb) is formed of copper.

As illustrated in FIG. 4K, the first layer (31Fa) formed on the inner wall surface (27F) has the first portion (60a) and the second portion (70a). The first portion (60a) and the second portion (70a) are formed at the same time. The first portion (60a) and the second portion (70a) are electrically connected. A leading end (62a) of the first portion (60a) is formed on a trailing end (72a) of the second portion (70a). The first layer (31Fa) formed on the inner wall surface (27F)

has a substantially step-shaped cross section. When metal particles are laminated on the steps 28 shown in FIG. 3 in a direction perpendicular to the first surface (22F), the first layer (31Fa) formed on the inner wall surface (27F) is formed in the above shape. Examples of sputtering conditions are described below. A distance between a target and the first surface (22F) of the first resin insulating layer (20F) is 50 mm or more and 250 mm or less. A voltage is 15 eV or more and 50 eV or less. A gas concentration is 0.1 Pa or more and 1.0 Pa or less.

The second layer (31Fb) formed on the first layer (31Fa) covering the inner wall surface (27F) has the first portion (60b) and the second portion (70b). The first portion (60b) and the second portion (70b) are formed at the same time. The first portion (60b) and the second portion (70b) are electrically connected. A leading end (62b) of the first portion (60b) is formed on a trailing end (72b) of the second portion (70b). The second layer (31Fb) formed on the inner wall surface (27F) has a substantially step-shaped cross section. Sputtering conditions are substantially the same as those described above.

The inner wall surface (27F) of the embodiment is formed of the surface (80a) of the resin 80 and the exposed surfaces (91b) of the first inorganic particles 91. These surfaces form a substantially common surface. The surface (80a) of the resin and the exposed surfaces (91b) are formed of different materials. And, the first layer (31Fa) is formed by sputtering. It is thought that the growth of the first layer (31Fa) formed on the surface (80a) of the resin 80 and the growth of the first layer (31Fa) formed on the exposed surfaces (91b) are different from each other. It is thought that the growth of the seed layer (30Fa) formed on the surface (80a) of the resin 80 and the growth of the seed layer (30Fa) formed on the exposed surfaces (91b) are different from each other. Therefore, in the embodiment, it is thought that the first portion (60a) and the second portion (70a) are formed. It is thought that the leading end (62a) of the first portion (60a) is formed on the trailing end (72a) of the second portion (70a). It is thought that the first layer (31Fa) has a substantially step-shaped cross section. It is thought that the second layer (31Fb) follows the first layer (31Fa). Therefore, it is thought that the second layer (31Fb) has the first portion (60b) and the second portion (70b). It is thought that the leading end (62b) of the first portion (60b) of the second layer (31Fb) is formed on the trailing end (72b) of the second portion (70b) of the second layer (31Fb). It is thought that the second layer (31Fb) has a substantially step-shaped cross section. Similarly, it is thought that the seed layer (30Fa) has the first portion 60 and the second portion 70. It is thought that the leading end 62 of the first portion 60 of the seed layer (30Fa) is formed on the trailing end 72 of the second portion 70 of the seed layer (30Fa). It is thought that the seed layer (30Fa) has a substantially step-shaped cross section.

The first layer (31Fa) on the inner wall surface (27F) is formed on the substantially smooth inner wall surface (27F). Therefore, in the embodiment, the first portion (60a) of the first layer (31Fa) and the second portion (70a) of the first layer (31Fa) can be formed to have substantially smooth surfaces. Similarly, the first portion (60b) of the second layer (31Fb) and the second portion (70b) of the second layer (31Fb) can be formed to have substantially smooth surfaces. The first portion 60 of the seed layer (30Fa) and the second portion 70 of the seed layer (30Fa) can be formed to have substantially smooth surfaces. When the surfaces are smooth, transmission loss can be reduced.

When the inner wall surface (27F) has the steps 28 shown in FIG. 3, the first layer (31Fa) having the first portion (60a)

and the second portion (70*a*) can be easily formed by sputtering. The seed layer (30Fa) having the first portion 60 and the second portion 70 can be easily formed. The leading end (62*a*) of the first portion (60*a*) can be formed on the trailing end (72*a*) of the second portion (70*a*). The leading end 62 of the first portion 60 can be formed on the trailing end 72 of the second portion 70. The first layer (31Fa) having a substantially stepped shape can be easily formed. The seed layer (30Fa) having a substantially stepped shape can be easily formed.

The first layer (31Fa) of the seed layer (30Fa) is formed of an alloy containing copper, aluminum and silicon. Aluminum has high ductility and high malleability. Therefore, adhesion between the first resin insulating layer (20F) and the first layer (31Fa) is high. It is thought that, even when the first resin insulating layer (20F) expands and contracts due to heat cycles, the seed layer (30Fa) containing aluminum can follow the expansion and contraction. Even when the first surface (22F) is smooth, the seed layer (30Fa) is unlikely to peel off from the first resin insulating layer (20F). It is thought that aluminum is easily oxidized. It is thought that, when the first inorganic particles 91 are inorganic particles 90 containing oxygen, the first layer (31Fa) formed on the inner wall surface (27F) of each of the first openings (26F) adheres to the first inorganic particles 91 via the oxygen in the inorganic particles 90 forming the inner wall surface (27F). The first layer (31Fa) is strongly bonded to the inner wall surface (27F). Adhesion between the inner wall surface (27F) of each of the first openings (26F) and the first layer (31Fa) can be increased. The seed layer (30Fa) is unlikely to peel off from the inner wall surface (27F). It is preferable that the inorganic particles 90 forming the inner wall surface (27F) contain oxygen.

The first surface (22F) is excellent in flatness. When the seed layer (30Fa) is formed on the first surface (22F) by sputtering, a distance between a target and the first surface (22F) is substantially constant. A seed layer (30Fa) having a substantially uniform thickness can be formed.

A plating resist is formed on the seed layer (30Fa). The plating resist has openings for forming the first signal wiring (32F), the second signal wiring (34F), and the lands (36F) (FIG. 1).

The electrolytic plating layer (30Fb) is formed on the seed layer (30Fa) exposed from the plating resist. The electrolytic plating layer (30Fb) fills the first openings (26F). The first signal wiring (32F), the second signal wiring (34F), and the lands (36F) (FIG. 1) are formed by the seed layer (30Fa) and the electrolytic plating layer (30Fb) on the first surface (22F). The first conductor layer (30F) is formed. The first via conductors (40F) (FIG. 1) are formed by the seed layer (30Fa) and the electrolytic plating layer (30Fb) in the first openings (26F). The first via conductors (40F) connect the through-hole conductors 8 and the lands (36F). The first signal wiring (32F) and the second signal wiring (34F) form a pair wiring.

Figure 4L:
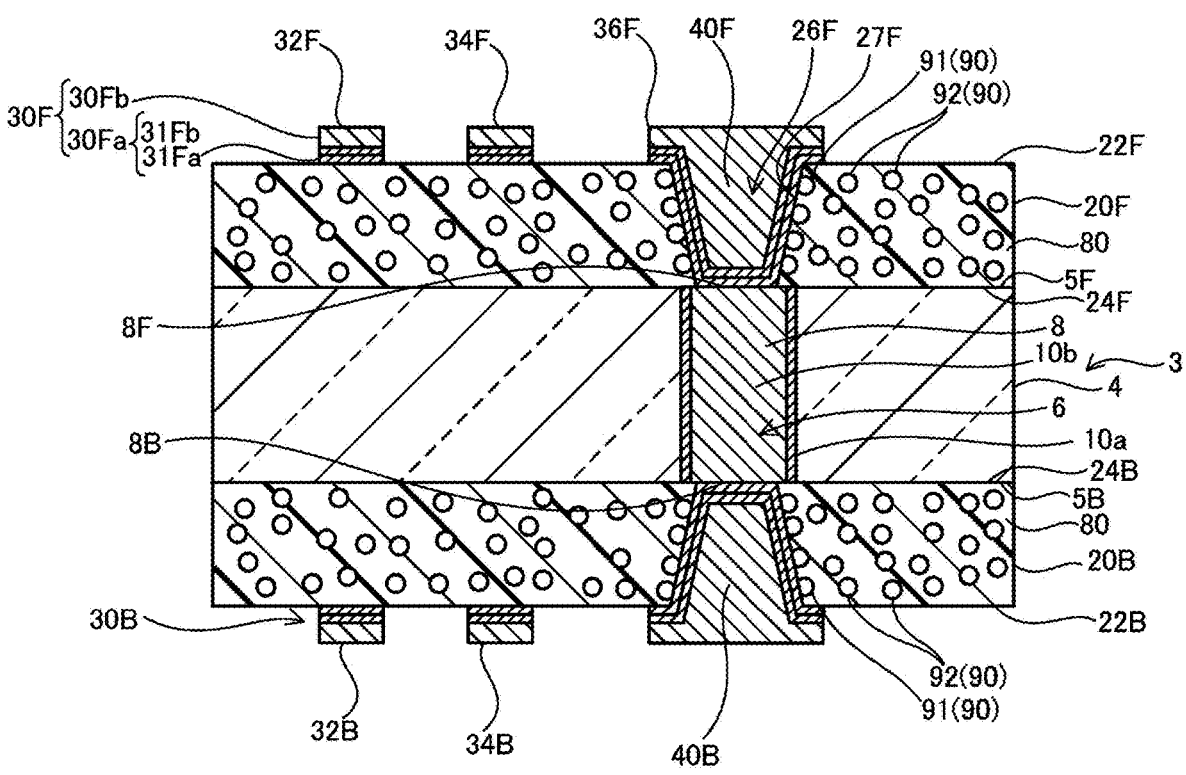
FIG. 4L is a cross-sectional view schematically illustrating a method for manufacturing a wiring substrate according to an embodiment of the present invention.

The plating resist is removed. The seed layer (30Fa) exposed from the electrolytic plating layer (30Fb) is removed. As illustrated in FIG. 4L, the first conductor layer (30F) and the first via conductors (40F) are formed at the same time.

The second resin insulating layer (120F) is formed on the first surface (22F) of the first resin insulating layer (20F) and on the first conductor layer (30F). The second conductor layer (130F) is formed on the first surface (122F) of the second resin insulating layer (120F). The second via conductors (140F) are formed in the second openings (126F) of the second resin insulating layer (120F). The second resin insulating layer (120F) is formed using the same method as the first resin insulating layer (20F). The second conductor layer (130F) is formed using the same method as the first conductor layer (30F). The second via conductors (140F) are formed using the same method as the first via conductors (40F). The wiring substrate 2 of the embodiment (FIG. 1) is obtained.

The core substrate 3 of the wiring substrate 2 of the embodiment (FIG. 1) includes the glass substrate 4. The glass substrate 4 is excellent in flatness. The first surface (22F, 22B) of the first resin insulating layer (20F, 20B) is formed of the resin 80. The first surface (22F, 22B) of the first resin insulating layer (20F, 20B) is formed only of the resin 80. The first surface (22F, 22B) of the first resin insulating layer (20F, 20B) does not include surfaces of the inorganic particles 90. The first surfaces (22F, 22B) of the first resin insulating layers (20F, 20B) are excellent in flatness and smoothness. Fine signal wirings (32F, 32B, 34F, 34B) can be formed on the first surfaces (22F, 22B) of the first resin insulating layers (20F, 20B). The first surfaces (122F, 122B) of the second resin insulating layers (120F, 120B) are similar to the first surfaces (22F, 22B) of the first resin insulating layers (20F, 20B). Therefore, fine signal wirings (132F, 132B, 134F, 134B) can be formed on the first surfaces (122F, 122B) of the second resin insulating layers (120F, 120B). The L/S of a signal wiring formed according to the embodiment is, for example, less than 5 μm/5 μm. The L/S of a signal wiring is preferably 1.5 μm/1.5 μm or more and 3.5 μm/3.5 μm or less. L means a width of a signal wiring, and S means a width of a space between adjacent signal wirings.

In the embodiment, the first layer formed on the inner wall surface is formed by sputtering. The resin insulating layer on the glass substrate 4 is unlikely to warp. Gaps that inhibit growth of a sputtered film are unlikely to occur between the resin 80 forming the inner wall surface of each of the openings for the via conductors and the first inorganic particles. The inner wall surface of the opening is unlikely to have large undulation or large unevenness. Even when the sputtered film on the inner wall surface has a small thickness, a continuous sputtered film can be formed.

The inner wall surface 27 of each of the openings (the first openings and the second openings) for the via conductors is formed of the resin 80 and the exposed surfaces (91*b*) of the flat parts (91*a*) of the first inorganic particles 91. It is thought that, when the first layer is formed, particles forming the sputtered film adhere to the first inorganic particles 91. It is thought that the particles forming the sputtered film are not embedded in the first inorganic particles 91. A thin and continuous seed layer can be formed on the inner wall surface. According to the embodiment, a thin and continuous seed layer can be formed on the first surface and the inner wall surface. When the seed layer is removed, an etching amount is small. Therefore, an etching amount of the electrolytic plating layer is small. A signal wiring has a width as designed. Fine signal wirings can be formed. A high quality wiring substrate 2 is provided.

In the wiring substrate 2 (FIG. 1) of the embodiment, the first surface (22F, 22B) of the first resin insulating layer (20F, 20B) is formed of the resin 80. No inorganic particles 90 are exposed from the first surface (22F, 22B). No unevenness is formed on the first surface (22F, 22B). An increase in standard deviation of a relative permittivity in a portion near the first surfaces (22F, 22B) of the first resin insulating layers (20F, 20B) is suppressed. The relative permittivity of the first surfaces (22F, 22B) does not significantly vary depending on a location. Even when the first signal wiring (32F, 32B) and the second signal wiring (34F, 34B) are in contact with the first surface (22F, 22B), a difference in propagation speed of an electrical signal between the first signal wiring (32F, 32B) and the second signal wiring (34F, 34B) can be reduced. Therefore, in the wiring substrate 2 of the embodiment, noise is suppressed. Even when a logic IC is mounted on the wiring substrate 2 of the embodiment, data transmitted via the first signal wiring (32F, 32B) and data transmitted via the second signal wiring (34F, 34B) arrive at the logic IC substantially without delay. Malfunction of the logic IC can be suppressed. Even when a length of the first signal wiring (32F, 32B) and a length of the second signal wiring (34F, 34B) are 5 mm or more, a difference in the propagation speed between the two can be reduced. Even when the length of the first signal wiring (32F, 32B) and the length of the second signal wiring (34F, 34B) are 10 mm or more and 20 mm or less, malfunction of the logic IC can be suppressed. The first surfaces (122F, 122B) of the second resin insulating layers (120F, 120B) are similar to the first surfaces (22F, 22B) of the first resin insulating layers (20F, 20B). Therefore, the first signal wirings (132F, 132B) and the second signal wirings (134F, 134B) have similar effects as the first signal wirings (32F, 32B) and the second signal wirings (34F, 34B). A high quality wiring substrate 2 is provided.

In the embodiment, a part of the first portion of the seed layer that covers the inner wall surface of each of the openings (the first openings and the second openings) for the via conductors is formed on the second portion (FIGS. 2A and 3). The first portion and the second portion partially overlap. Therefore, strength of the seed layer is high. Since the glass core substrate and the resin insulating layer are significantly different in thermal expansion coefficient, when the wiring substrate 2 is subjected to heat cycles, a stress occurs between the resin insulating layer and the seed layer. Even when the resin insulating layer expands and contracts due to heat cycles, it is thought that the stress can be relaxed by partial overlapping the first portion and the second portion. Or, it is thought that the seed layer can follow the expansion and contraction. Therefore, the seed layer is unlikely to break. The seed layer is formed of the substantially smooth first portion and the substantially smooth second portion. Therefore, transmission loss is low when a high frequency signal is transmitted. A high quality wiring substrate 2 is provided.

First Alternative Example

In a first alternative example of the embodiment, the specific metal contained in the alloy forming the first layer is at least one of nickel, zinc, gallium, silicon, and magnesium.

Second Alternative Example

In a second alternative example of the embodiment, the alloy forming the first layer does not contain carbon.

Third Alternative Example

In a third alternative example of the embodiment, the alloy forming the first layer does not contain oxygen.

MODIFIED EXAMPLES

Figure 5:
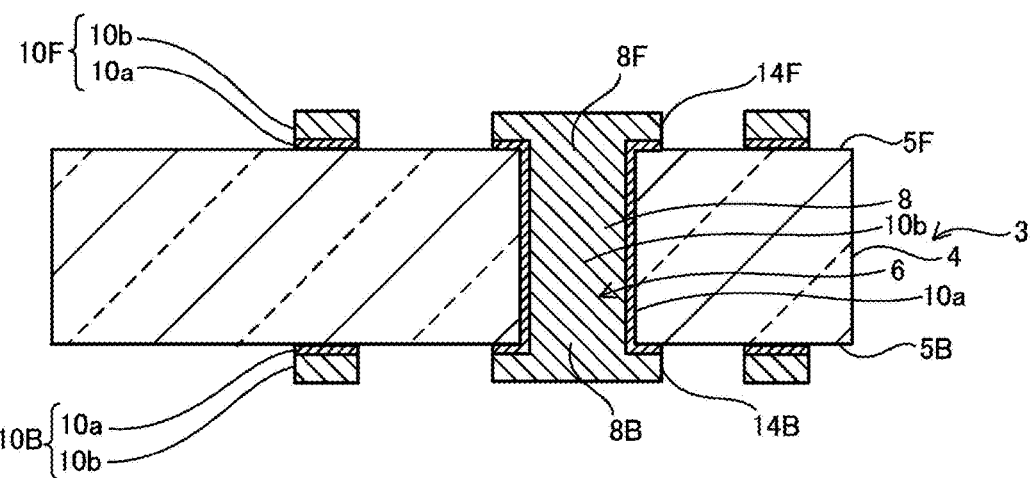
FIG. 5 is a cross-sectional view schematically illustrating a method for manufacturing a wiring substrate according to a modified example of the present invention.
Figure 6:
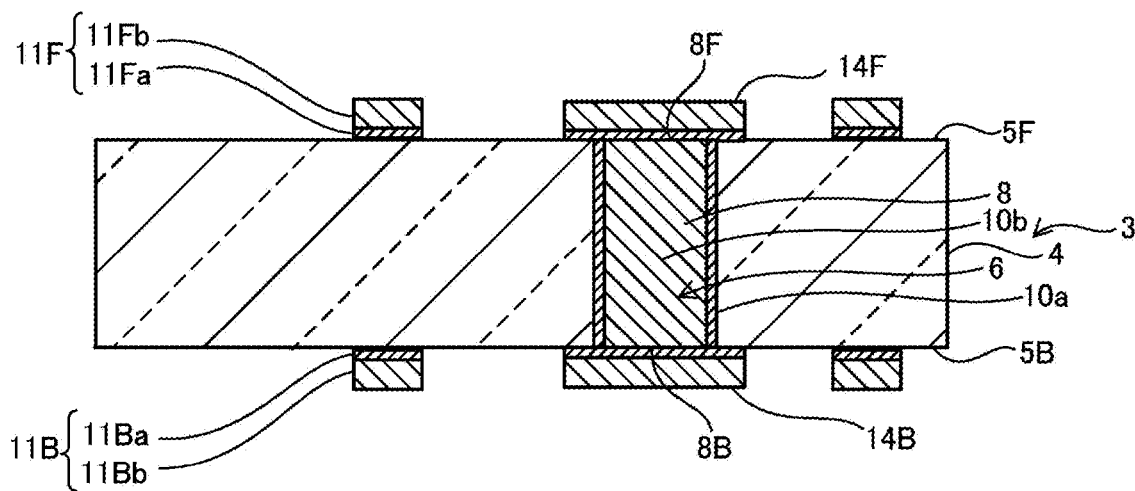
FIG. 6 is a cross-sectional view schematically illustrating a method for manufacturing a wiring substrate according to a modified example of the present invention.

Similar to the embodiment, wiring substrates of modified examples each include a core substrate 3, a front side build-up layer (300F), and a back side build-up layer (300B). The core substrate 3 of the embodiment is different from the core substrates 3 of the modified examples. The front side build-up layer (300F) of the embodiment is the same as the front side build-up layer (300F) of each of the modified examples. The back side build-up layer (300B) of the embodiment is the same as the back side build-up layer (300B) of each of the modified examples. Cross-sections of the core substrates 3 of the modified examples are respectively illustrated in FIGS. 5 and 6. As illustrated in FIGS. 5 and 6, the core substrates 3 of the modified examples respectively have conductor layers (10F, 11F) on the front surface (5F) of the glass substrate 4. The conductor layers (10F, 11F) each include lands (14F) covering the upper ends (8F) of the through-hole conductors 8. Further, the core substrates 3 of the modified examples respectively have conductor layers (10B, 11B) on the back surface (5B) of the substrate 4. The conductor layers (10B, 11B) each include lands (14B) covering the lower ends (8B) of the through-hole conductors 8. The lands (14F) and the lands (14B) are electrically connected by the through-hole conductors 8. The core substrate 3 of the embodiment has no conductor layer on the front surface (5F) and no conductor layer on the back surface (5B).

In the modified examples, the front side resin insulating layer (resin insulating layer directly above the core substrate) forming the front side build-up layer (300F) is formed on the conductor layer (10F, 11F) and the front surface (5F). The resin insulating layer (first resin insulating layer (20F)) directly above the core substrate has openings (first openings (26F)) for via conductors reaching the lands (14F). Via conductors (first via conductors (40F)) similar to those of the embodiment are formed in the openings for via conductors. Since the via conductors penetrating the resin insulating layer directly above the core substrate reach the lands (14F), the seed layer (first layer (31Fa)) forming the via conductors is in contact with upper surfaces of the lands (14F) and inner wall surfaces of the openings. The via conductors penetrating the resin insulating layer directly above the core substrate are electrically connected to the through-hole conductors 8 via the lands (14F).

In the modified examples, the back side resin insulating layer (resin insulating layer directly below the core substrate) forming the back side build-up layer (300B) is formed on the conductor layer (10B, 11B) and the back surface (5B). The resin insulating layer (first resin insulating layer (20B)) directly below the core substrate has openings (first openings) for via conductors reaching the lands (14B). Via conductors (first via conductors (40B)) similar to those of the embodiment are formed in the openings for via conductors. Since the via conductors penetrating the resin insulating layer directly below the core substrate reach the lands (14B), the seed layer forming the via conductors is in contact with upper surfaces of the lands (14B) and inner wall surfaces of the openings. The via conductors penetrating the resin insulating layer directly below the core substrate are electrically connected to the through-hole conductors 8 via the lands (14B).

Method for Manufacturing Wiring Substrates of Modified Examples

The core substrate 3 illustrated in FIG. 5 is a core substrate 3 of a first example. A method for manufacturing the core substrate 3 of the first example is described below. An intermediate substrate illustrated in FIG. 4D is prepared. The conductor layer (10F) is formed on the front surface (5F) using a subtractive method. The conductor layer (10B)

is formed on the back surface (5B). The core substrate 3 of the first example of the modified examples is obtained.

The conductor layer (10F) is formed of the seed layer (10a) and the electrolytic plating layer (10b) on the seed layer (10a). The conductor layer (10B) is formed of the seed layer (10a) and the electrolytic plating layer (10b) on the seed layer (10a). The seed layer (10a) is formed by electroless plating. The seed layer (10a) forming the conductor layer (10F), the seed layer (10a) forming the conductor layer (10B), and the seed layer (10a) forming the through-hole conductors 8 are common. The electrolytic plating layer (10b) forming the conductor layer (10F), the electrolytic plating layer (10b) forming the conductor layer (10B), and the electrolytic plating layer (10b) forming the through-hole conductors 8 are common. The conductor layers (10F, 10B) and the through-hole conductors 8 are formed at the same time. The through-hole conductors 8 and the lands (14F, 14B) are formed at the same time. The through-hole conductors 8 and the lands (14F, 14B) are integrally formed. There is no seed layer between the upper ends (8F) and the lands (14F). There is no seed layer between the lower ends (8B) and the lands (14B).

The core substrate 3 illustrated in FIG. 6 is a core substrate 3 of a second example. A method for manufacturing the core substrate 3 of the second example is described below. An intermediate substrate illustrated in FIG. 4E is prepared. Seed layers (11Fa, 11Ba) are respectively formed on the front surface (5F) and the back surface (5B). The seed layers (11Fa, 11Ba) are formed by electroless plating. It is also possible that the seed layers (11Fa, 11Ba) are formed by sputtering. The seed layer (11Fa) covers the front surface (5F) of the substrate 4 and the upper ends (8F) of the through-hole conductors 8. The seed layer (11Ba) covers the back surface (5B) of the substrate 4 and the lower ends (8B) of the through-hole conductors 8. Electrolytic plating layers (11Fb, 11Bb) are respectively formed on the seed layers (11Fa, 11Ba). After that, the conductor layers (11F, 11B) are formed using a subtractive method. The core substrate 3 of the second example of the modified examples is obtained.

The conductor layer (11F) is formed of the seed layer (11Fa) and the electrolytic plating layer (11Fb) on the seed layer (11Fa). The conductor layer (11B) is formed of the seed layer (11Ba) and the electrolytic plating layer (11Bb) on the seed layer (11Ba). The seed layer (11Fa) is formed on the front surface (5F) of the substrate 4. The seed layer (11Fa) covers the upper ends (8F) of the through-hole conductors 8. The seed layer (11Ba) is formed on the back surface (5B) of the substrate 4. The seed layer (11Ba) covers the lower ends (8B) of the through-hole conductors 8. The seed layers (11Fa, 11Ba) are formed by electroless plating. It is also possible that the seed layers (11Fa, 11Ba) are formed by sputtering. The seed layers (11Fa, 11Ba) that respectively form the conductor layers (11F, 11B) and the seed layer (10a) that forms the through-hole conductors 8 are different from each other. The electrolytic plating layers (11Fb, 11Bb) that respectively form the conductor layers (11F, 11B) and the electrolytic plating layer (10b) that forms the through-hole conductors 8 are different from each other. The conductor layers (11F, 11B) and the through-hole conductors 8 are separately formed. In the second example, the seed layer (11Fa) forming the lands (14F) exists between the electrolytic plating layer (10b) forming the upper ends (8F) and the electrolytic plating layer (11Fb) forming the lands (14F). The seed layer (11Ba) forming the lands (14B) exists between the electrolytic plating layer (10b) forming the lower ends (8B) and the electrolytic plating layer (11Bb) forming the lands (14B). In contrast, in the first example (FIG. 5), the electrolytic plating layer (10b) forming the upper ends (8F) and the electrolytic plating layer (10b) forming the lands (14F) are continuous. The electrolytic plating layer (10b) forming the lower ends (8B) and the electrolytic plating layer (10b) forming the lands (14B) are continuous.

The front side build-up layer (300F) and back side build-up layer (300B) are formed on each of the core substrates 3 of the modified examples in the same way as the embodiment.

In the present specification, the term "flat surface" is used with respect to the shape of the inner wall surface, the shapes of the flat parts (91a), and the shapes of the first inorganic particles 91. The meaning of the "flat surface" used with respect to these is illustrated in FIGS. 1 and 2A. That is, in FIGS. 1 and 2A, the inner wall surface is drawn substantially straight. The shape of the inner wall surface in FIGS. 1 and 2A is substantially a straight line. The term "flat surface" in the present specification includes a substantially straight line illustrated in a cross section. As illustrated in the cross sections of the first inorganic particles 91 in FIGS. 1 and 2A, in a cross section, cutting along a flat surface includes cutting along a straight line. The term "flat surface" in the present specification does not mean a perfect flat surface but includes a substantially flat surface. A substantially flat surface may include small unevenness.

In Japanese Patent Application Laid-Open Publication No. 2015-133473, light transmittance of a first insulating layer formed of a glass material is controlled. As an example of a method for controlling the light transmittance, Japanese Patent Application Laid-Open Publication No. 2015-133473 describes that a coloring agent is contained in the first insulating layer. It is thought difficult for the first insulating layer formed of a glass material to uniformly contain a coloring agent.

A wiring substrate according to an embodiment of the present invention includes: a core substrate that has a substrate formed of glass, a through hole penetrating the substrate, and a through-hole conductor formed in the through hole; a resin insulating layer that is formed on the core substrate, and has a first surface, a second surface on the opposite side with respect to the first surface, and an opening for a via conductor extending from the first surface to the second surface; a first conductor layer that is formed on the first surface of the resin insulating layer; and a via conductor that is formed in the opening and electrically connects the through-hole conductor and the first conductor layer. The first conductor layer and the via conductor are formed of a seed layer and an electrolytic plating layer formed on the seed layer. The seed layer covering an inner wall surface of the opening has a substantially smooth first portion and a substantially smooth second portion. The first portion and the second portion are electrically connected to each other, and a part of the first portion is formed on the second portion.

In a wiring substrate according to an embodiment of the present invention, the core substrate includes the glass substrate. The glass substrate is excellent in flatness. Therefore, the first surface of the resin insulating layer is excellent in flatness. The first surface is excellent in smoothness. Fine signal wirings can be formed on the first surface of the resin insulating layer. A part of the first portion of the seed layer covering the inner wall surface of the opening is formed on the second portion. The first portion and the second portion partially overlap. Therefore, strength of the seed layer is high. Since the glass core substrate and the resin insulating layer are significantly different in thermal expansion coefficient, when the wiring substrate is subjected to heat cycles, a stress occurs between the resin insulating layer and the seed layer. Even when the resin insulating layer expands and contracts due to heat cycles, since the first portion and the second portion partially overlap, it is thought that the stress can be relaxed. Or, it is thought that the seed layer can follow the expansion and contraction. Therefore, the seed layer is unlikely to break. The seed layer is formed of the substantially smooth first portion and the substantially smooth second portion. Therefore, transmission loss is low when a high frequency signal is transmitted. A high quality wiring substrate is provided.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:
a core substrate having a through-hole conductor;
a resin insulating layer formed on the core substrate;
a conductor layer formed on the resin insulating layer and comprising a seed layer and an electrolytic plating layer formed on the seed layer; and
a via conductor formed in the resin insulating layer such that the via conductor electrically connects the through-hole conductor and the conductor layer and that the via conductor includes the seed layer and electrolytic plating layer extending from the conductor layer,
wherein the core substrate includes a glass substrate and has a through hole penetrating through the glass substrate such that the through-hole conductor is formed in the through hole, and the via conductor is formed such that the seed layer is covering an inner wall surface of the resin insulating layer in an opening in which the via conductor is formed, that the seed layer has a first portion and a second portion electrically connected to the first portion and that a part of the first portion is formed on the second portion.

2. The wiring substrate according to claim 1, wherein the seed layer in the via conductor is formed such that a leading end of the first portion is formed on a trailing end of the second portion.

3. The wiring substrate according to claim 1, wherein the seed layer in the via conductor is formed such that the first portion and the second portion are formed in a same process.

4. The wiring substrate according to claim 1, wherein the via conductor is formed such that the seed layer in the via conductor has a step-shaped cross section.

5. The wiring substrate according to claim 1, wherein the via conductor is formed such that the seed layer includes a first layer covering the inner wall surface of the resin insulating layer in the opening and a second layer formed on the first layer and that the first layer has the first portion and the second portion.

6. The wiring substrate according to claim 5, wherein the seed layer in the via conductor is formed such that a leading end of the first portion is formed on a trailing end of the second portion.

7. The wiring substrate according to claim 5, wherein the via conductor is formed such that the first layer of the seed layer has a step-shaped cross section.

8. The wiring substrate according to claim 1, wherein the resin insulating layer includes resin, first inorganic particles and second inorganic particles such that the first inorganic particles have flat parts and that the resin and the flat parts of the first inorganic particles are forming the inner wall surface in the opening.

9. The wiring substrate according to claim 8, wherein the resin insulating layer is formed such that the inner wall surface in the opening has steps formed between the resin and the flat parts of the first inorganic particles.

10. The wiring substrate according to claim 1, wherein the conductor layer and via conductor are formed such that the seed layer includes an alloy comprising copper, aluminum, and at least one metal selected from the group consisting of nickel, zinc, gallium, silicon, and magnesium.

11. The wiring substrate according to claim 10, wherein the at least one metal of the alloy in the seed layer includes silicon.

12. The wiring substrate according to claim 10, wherein the seed layer in the conductor layer and via conductor is formed such that a content of the aluminum in the alloy is in a range of 1.0 at % to 15.0 at %.

13. The wiring substrate according to claim 10, wherein the seed layer in the conductor layer and via conductor is formed such that the alloy includes carbon in a content of 50 ppm or less.

14. The wiring substrate according to claim 10, wherein the seed layer in the conductor layer and via conductor is formed such that the alloy includes oxygen in a content of 100 ppm or less.

15. The wiring substrate according to claim 11, wherein the seed layer in the conductor layer and via conductor is formed such that a content of the silicon in the alloy is in a range of 0.5 at % to 10.0 at %.

16. The wiring substrate according to claim 11, wherein the seed layer in the conductor layer and via conductor is formed such that a content of the aluminum in the alloy is in a range of 1.0 at % to 15.0 at %.

17. The wiring substrate according to claim 11, wherein the seed layer in the conductor layer and via conductor is formed such that the alloy includes carbon in a content of 50 ppm or less and oxygen in a content of 100 ppm or less.

18. A method for manufacturing a wiring substrate, comprising:
forming a core substrate having a through-hole conductor;
forming a resin insulating layer on the core substrate;
forming a conductor layer on the resin insulating layer such that the conductor layer includes a seed layer and an electrolytic plating layer formed on the seed layer; and
forming a via conductor in the resin insulating layer such that the via conductor electrically connects the through-hole conductor and the conductor layer and that the via conductor includes the seed layer and electrolytic plating layer extending from the conductor layer,
wherein the forming the core substrate includes forming a through hole penetrating through a glass substrate and forming the through-hole conductor in the through hole, and the forming the via conductor includes forming the seed layer in an opening formed in the resin insulating layer such that the seed layer covers an inner wall surface of the resin insulating layer in the opening, that the seed layer has a first portion and a second portion electrically connected to the first portion and that a part of the first portion is formed on the second portion.

19. The method for manufacturing a wiring substrate according to claim 18, wherein the forming the resin insulating layer includes forming the resin insulating layer comprising resin and inorganic particles, and the forming the via conductor includes forming the opening in the resin insulating layer such that the inorganic particles have protruding portions protruding from the resin forming the inner wall surface in the opening, and removing the protruding portions of the inorganic particles.

20. The wiring substrate according to claim 18, wherein the forming the resin insulating layer includes forming the resin insulating layer comprising resin and inorganic particles, and the forming the via conductor includes forming the opening in the resin insulating layer such that the inorganic particles have protruding portions protruding from the resin forming the inner wall surface in the opening, and removing the protruding portions of the inorganic particles such that the inner wall surface in the opening includes exposed surfaces of the inorganic particles.

\* \* \* \* \*